United States Patent [19]
Onoguchi et al.

[11] Patent Number: 6,067,164
[45] Date of Patent: May 23, 2000

[54] METHOD AND APPARATUS FOR AUTOMATIC ADJUSTMENT OF ELECTRON OPTICS SYSTEM AND ASTIGMATISM CORRECTION IN ELECTRON OPTICS DEVICE

[75] Inventors: Kazunori Onoguchi; Hiroaki Nakai, both of Osaka, Japan

[73] Assignee: Kabushiki Kaisha Toshiba, Kawasaki, Japan

[21] Appl. No.: 08/928,662

[22] Filed: Sep. 12, 1997

[30] Foreign Application Priority Data

Sep. 12, 1996 [JP] Japan .................................. 8-241903
Sep. 30, 1996 [JP] Japan .................................. 8-259514
Mar. 4, 1997 [JP] Japan .................................. 9-048962

[51] Int. Cl.$^7$ ............................ G01B 11/00; G01N 23/00
[52] U.S. Cl. ...................... 356/401; 356/372; 356/399; 250/310; 250/307; 250/311
[58] Field of Search .................... 356/401, 372, 356/399; 250/310, 307, 311

[56] References Cited

U.S. PATENT DOCUMENTS

| | | |
|---|---|---|
| 4,392,054 | 7/1983 | Sato et al. .............................. 250/310 |
| 4,567,369 | 1/1986 | Smith et al. ............................ 250/310 |
| 5,313,062 | 5/1994 | Yamada .................................. 250/310 |
| 5,627,373 | 5/1997 | Keese .................................... 250/310 |

*Primary Examiner*—Frank G. Font
*Assistant Examiner*—Roy M. Punnoose
*Attorney, Agent, or Firm*—Foley Lardner

[57] ABSTRACT

A scheme for realizing the automatic adjustment of the electron optics system in an electron optics device such as scanning electron microscope, in which a prescribed number of images sequentially obtained by the electron optics device at sequentially adjusted focal points are stored; a moving amount of a sample image in the stored images is calculated; whether an adjustment of the electron optics system of the electron optics device is necessary or not is judged according to the calculated moving amount of the sample image; and the electron optics system of the electron optics device is adjusted according to the moving amount of the sample image when it is judged that the adjustment of the electron optics system of the electron optics device is necessary. A scheme for realizing the astigmatism correction in a charged particle beam optical system of an electron optics device such as scanning electron microscope is also disclosed.

39 Claims, 26 Drawing Sheets

FIG.9
| 1 | 1 | 1 |
|---|---|---|
| 1 | 1 | 1 |
| 1 | 1 | 1 |
FIG.10
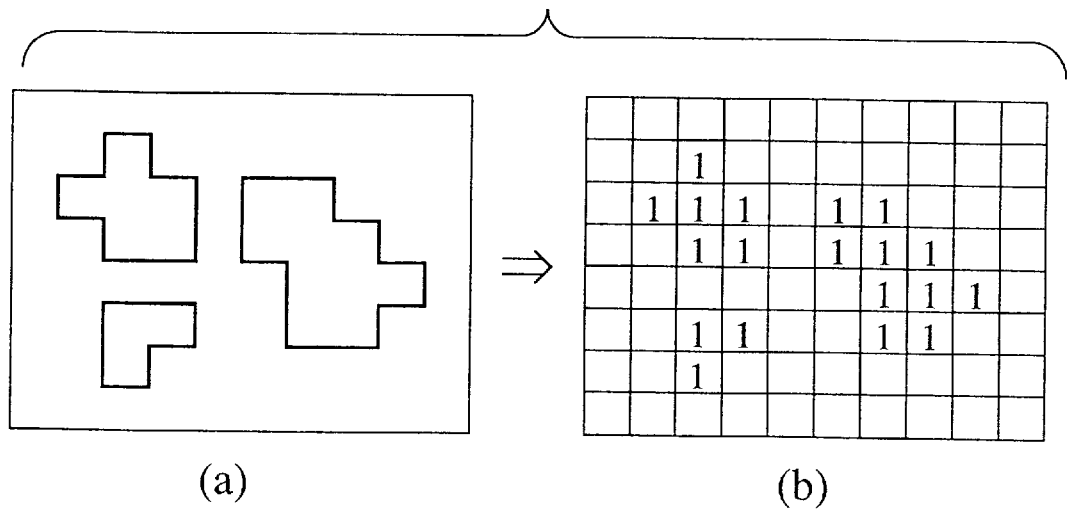
(a)　　　　　　　　(b)
FIG.11
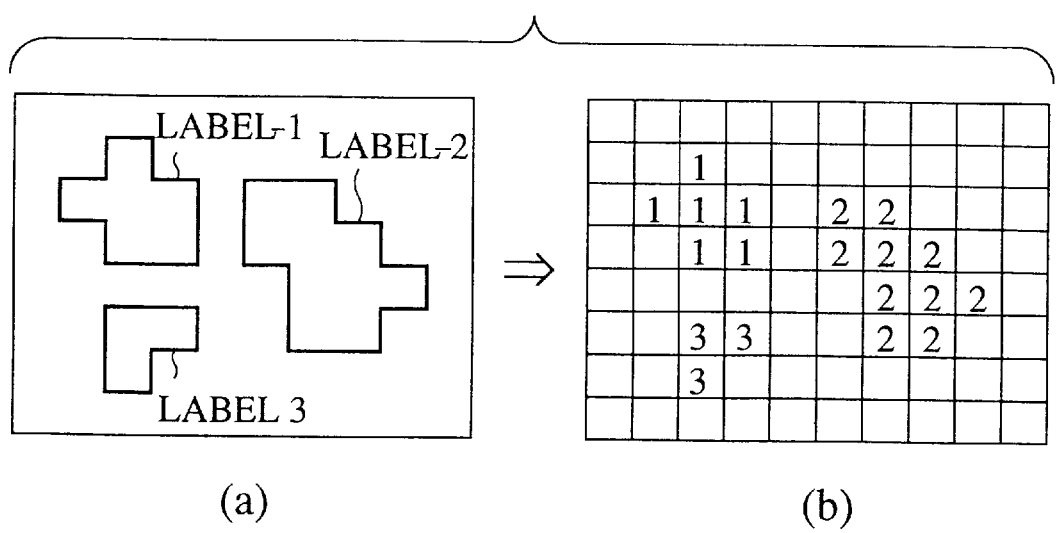
(a)　　　　　　　　(b)

FIG.13

|  | $-5\mu m \rightarrow 0\mu m$ (x.y)MOVING AMOUNT (PIXELS) | $0\mu m \rightarrow +5\mu m$ (x.y)MOVING AMOUNT (PIXELS) |
|---|---|---|
| contact hole#1 | (+17.61,+20.40) | (+13.67,+26.40) |
| contact hole#2 | (+18.03,+30.68) | (+14.32,+26.76) |
| contact hole#3 | (+16.91,+30.34) | (+13.94,+23.82) |
| contact hole#4 | (+16.53,+30.73) | (+14.24,+24.89) |
| contact hole#5 | (+16.05,+31.17) | (+14.78,+24.86) |
| contact hole#6 | (+17.58,+32.10) | (+13.93,+25.99) |
| AVERAGE | (+17.12,+30.74) | (+14.15,+25.45) |

FOR x-AXIS, +: RIGHT
              −: LEFT
FOR y-AXIS, +: DOWN
              −: UP

FOCAL POINT ADJUSTMENT AMOUNT

SPATIAL DIRECTION ( x or y )

(a) HORIZONTAL SEARCH REGION (b) VERTICAL SEARCH REGION

METHOD AND APPARATUS FOR AUTOMATIC ADJUSTMENT OF ELECTRON OPTICS SYSTEM AND ASTIGMATISM CORRECTION IN ELECTRON OPTICS DEVICE

BACKGROUND OF THE INVENTION

1. Field of the Invention

The present invention relates to a scheme for automatic adjustment of electron optics system, and for astigmatism correction in a charged particle beam optical system, of an electron optics device such as a scanning electron microscope.

2. Description of the Background Art

The Scanning Electron Microscope (SEM) is widely used in a variety of fields including the semiconductor inspection. In order to inspect the fine structure on a surface of a sample such as a semicondutor at high magnification, it is necessary to have the electron optics system of the SEM accurately adjusted all the time. In other words, a clear image of the fine structure on the sample cannot be obtained unless the SEM electron optics system is adjusted in such a manner that the electron beam to be irradiated from an electron gun of the SEM is sufficiently narrowed down by the electron optics system so that the electron beam is passing through a center of the electron optics system and focused on a single point on the sample.

There are several types of the adjustment operations for such an electron optics system, and among them, an adjustment operation for aligning an objective lens aperture stop so that the electron beam passes through a central axis of the electron optics system is called the objective lens alignment.

If this objective lens alignment is inaccurate, that is, if a center of the objective lens aperture stop is not aligned with the axis of the electron beam, a sample image moves within the image field when an operation to adjust the focal point with respect to the sample is carried out. This situation can cause the so called astigmatism in which a shape of the irradiated electron beam spot on the sample deviates from a true circle, and lead to the lowering of the image resolution. For this reason, usually, the operator manually operates the objective lens while outputting an over-focused image and a under-focused image alternately, and adjusts a position of the objective lens aperture stop to a position at which an object image no longer moves within the image field.

The objective lens alignment is easily affected by the external vibrations, etc. exerted on the SEM, so that there is a need to adjust the objective lens alignment either regularly or whenever the SEM is used, and this adjustment operation is usually realized by the manual operation of the operator which is carried out while watching the SEM image. However, this adjustment operation is a kind of operation that requires skills and there are not many operators who can carry out this adjustment operation accurately, so that it is difficult for a general SEM user to carry out this adjustment operation accurately.

In addition, when the SEM is used for the semiconductor inspection, for example, a time required for the judgement of the electron optics system largely affects the throughput of the inspection, and this has conventionally been a factor for lowering the throughput of the semiconductor inspection process, so that there is a demand for a mechanism to automatically realize the adjustment of the electron optics system in the SEM.

In further detail, the SEM has been used for the purpose of observing the surface state of the semiconductor element in recent years, and its resolution has been as good as 1 nm or less. In the following, a general configuration of this type of SEM will be briefly described In the SEM of FIG. 1, a field emission type electron gun 3 is formed by a cathode 1 and anode 2, and a high luminance electron beam 4 is emitted from this electron gun 3. The electron beam 4 is narrowed through a condenser lens 5, an aperture stop 7 and an objective lens 6, and irradiated onto a surface of a sample 8. At this point, the secondary electrons emitted from the sample surface are detected by a detector 11. The electron beam 4 is two-dimensionally scanned over the sample 8 mounted on a sample holder 9 by means of a deflector 10 which is controlled by a scanning control circuit 12. The information on the sample surface is obtained by displaying signals from the detector 11 on an image display device 13 in synchronization with this scanning operation.

Now, in this type of focusing system using the objective lens 6, there is an aberration called astigmatism in general. This astigmatism is caused because the focused position of the electron beam is displaced along two axial directions perpendicular to the beam axis. When this type of aberration exists, a beam cross section shape on the sample surface changes as shown in parts (a), (b) and (c) of FIG. 2 depending on the focal lengths of the objective lens 6. Here, a beam radius in a state where a circular beam as shown in a part (b) of FIG. 2 is obtained becomes larger than that in a case where no astigmatism exists. This aberration is caused because the focal lengths in two directions are different.

For this reason, conventionally, a mechanism 15 for generating the quadruple electric or magnetic field called "stigmater" is provided inside a charged particle beam optical system formed by the electron gun 3, the condenser lens 5, the objective lens 6 and the aperture stop 7, so as to correct the astigmatism. More specifically, the quadruple stigmater formed by four electromagnets or electrodes is provided in a state capable of being rotated for 45 degrees around the optical axis below the objective lens 6, or two sets of quadruple stigmaters are provided at relative angle of 45 degrees with each other and their intensities are adjusted, so that the focused positions on two directions, X direction and Y direction, coincide with each other.

Next, with reference to FIG. 3, the conventionally used astigmatism correction scheme will be described. In a case of observing a sample as shown in a part (a) of FIG. 3, when the astigmatism exists, that is, when the beam cross section shape as shown in a part (a) of FIG. 2 is used for example, the image displayed on the display device 13 appears to have a direction in which the edge resolution is high and a direction in which the edge resolution is low as shown in parts (b) and (c) of FIG. 3, respectively.

Then, when the focal length of the objective lens 6 is changed so that the beam cross section shape becomes as shown in a part (c) of FIG. 2, a direction with a high edge resolution and a direction with a low edge resolution are switched. In such a case, the stigmater 15 is adjusted so that the directionality of the image disappears even when the focal length of the objective lens 6 is changed. At this point, the beam cross section shape changes as shown in parts (a), (b) and (c) of FIG. 4 where only the beam radius of the circular beam is changed.

In a case of carrying out this astigmatism correction automatically, the following operations will be required. First, contrasts of images obtained by using different lens focal lengths are obtained and a position at which the contrast is maximum is determined. When the astigmatism is large, there are cases in which two local maxima appear, and in such a case, a central point between two local maxima is determined. Then, at the focal position determined in this manner, the contrast is maximized by adjusting the stigmater in the X direction. Next, the contrast is maximized by adjusting the stigmater in the Y direction. By repeating the above operations, a converging position is determined as the optimum position.

However, this type of astigmatism correction scheme has been associated with the following problems. Namely, the stigmater has been adjusted by an operator while watching the image displayed on the display device, so that the adjustment of the stigmater has been relying on a visual sense of the operator and therefore an accuracy of the adjustment depends on skills of the operator. In addition, if the adjustment of the stigmater is not perfect, the observation precision is lowered. Moreover, it has been time consuming as it has been done manually, and therefore it has been required to irradiate beams onto the sample more than absolutely necessary. This in turn causes a damage on the sample or a change in the resist shape, so that it is generally undesirable. Furthermore, when the sample has a directionality, the correction is difficult.

Also, the conventional scheme for automatic astigmatism correction has only a limited range that can possibly be corrected compared with the manual correction in a case of dealing with a practical sample, and its accuracy is inferior to that obtained by the manual correction in most cases.

In addition, in a case of observing the sample as shown in a part (a) of FIG. 3, when the beam cross section shapes are as shown in parts (a), (b) and (c) of FIG. 5 for example, the resolutions are nearly equal in two directions perpendicular to two sides of the sample, so that the astigmatism correction is difficult. This situation is the same in a case of automatic astigmatism correction.

Note that the above noted problems are not only relevant to an observation device such as SEM, but also relevant to a charged particle beam drawing device using electron beam or ion beam as well.

SUMMARY OF THE INVENTION

It is therefore an object of the present invention to provide a method and an apparatus for realizing the automatic adjustment of the electron optics system in an electron optics device such as scanning electron microscope, in which the adjustment operation of the electron optics system is automatically realized by means of an additional device for processing images obtained from the electron optics device, so that a work load on the operator can be reduced while the throughput of the process such as the semiconductor inspection can be improved considerably.

It is another object of the present invention to provide a method and an apparatus for realizing the astigmatism correction in a charged particle beam optical system of an electron optics device such as scanning electron microscope, which are capable of carrying out the astigmatism correction at high speed and high precision, while preventing the lowering of the observation precision due to the charged particle beam cross section shape.

According to one aspect of the present invention there is provided an electron optics system automatic adjustment apparatus for automatically adjusting an electron optics system of an electron optics device, comprising: a focal point adjustment unit for carrying out a focal point adjustment by changing a refractive index of an objective lens of the electron optics device; an image storage unit for storing a prescribed number of images sequentially obtained by the electron optics device at focal points adjusted by the focal point adjustment unit; a moving amount calculation unit for calculating a moving amount of a sample image in said prescribed number of images stored by the image storage unit; an adjustment processing control unit for judging whether an adjustment of the electron optics system of the electron optics device is necessary or not according to the moving amount of the sample image calculated by the moving amount calculation unit; and an optics system adjustment unit for adjusting the electron optics system of the electron optics device according to the moving amount of the sample image when the adjustment processing unit judges that the adjustment of the electron optics system of the electron optics device is necessary.

According to another aspect of the present invention there is provided an electron optics system automatic adjustment method for automatically adjusting an electron optics system of an electron optics device, comprising the steps of: carrying out a focal point adjustment by changing a refractive index of an objective lens of the electron optics device; storing a prescribed number of images sequentially obtained by the electron optics device at focal points adjusted by the focal point adjustment; calculating a moving amount of a sample image in said prescribed number of images stored by the storing step; judging whether an adjustment of the electron optics system of the electron optics device is necessary or not according to the moving amount of the sample image calculated by the calculating step; and adjusting the electron optics system of the electron optics device according to the moving amount of the sample image when the judging step judges that the adjustment of the electron optics system of the electron optics device is necessary.

According to another aspect of the present invention there is provided an article of manufacture, comprising: a computer usable medium having computer readable program code means embodied therein for causing a computer to function as an electron optics system automatic adjustment apparatus for automatically adjusting an electron optics system of an electron optics device, the computer readable program code means including: first computer readable program code means for causing said computer to control the electron optics device to carry out a focal point adjustment by changing a refractive index of an objective lens of the electron optics device; second computer readable program code means for causing said computer to store a prescribed number of images sequentially obtained by the electron optics device at focal points adjusted by an operation of the first computer readable program code means; third computer readable program code means for causing said computer to calculate a moving amount of a sample image in said prescribed number of images stored by an operation of the second computer readable program code means; fourth computer readable program code means for causing said computer to judge whether an adjustment of the electron optics system of the electron optics device is necessary or not according to the moving amount of the sample image calculated by the third computer readable program code means; and fifth computer readable program code means for causing said computer to control the electron optics device to adjust the electron optics system of the electron optics device according to the moving amount of the sample image when the fourth computer readable program code means judges that the adjustment of the electron optics system of the electron optics device is necessary.

According to another aspect of the present invention there is provided an astigmatism correction apparatus for correcting an astigmatism in an electron optics device by adjusting a stigmater of a charged particle beam optical system in the electron optics device, comprising: a secondary particle signal extraction unit for extracting secondary particle signals resulting from a two-dimensional scan of a charged particle beam over a sample by the electron optics device; a Fourier transform unit for calculating a power spectrum by applying a two-dimensional Fourier transform to the secondary particle signals extracted by the secondary particle signal extraction unit; a binarization unit for binarizing the power spectrum calculated by the Fourier transform unit to obtain a binarized image; an axis extraction unit for obtaining a principal axis and an axis perpendicular to the principal axis of the binarized image obtained by the binarization unit; an astigmatism information calculation unit for determining an intensity and a direction of the astigmatism by obtaining a distance between two points at which a sample image region in the binarized image intersects with the principal axis and a distance between two points at which the sample image region in the binarized image intersect with the axis perpendicular to the principal axis; and an adjustment unit for adjusting the stigmater of the charged particle beam optical system according to the intensity and the direction of the astigmatism determined by the astigmatism information calculation unit.

According to another aspect of the present invention there is provided an astigmatism correction method for correcting an astigmatism in an electron optics device by adjusting a stigmater of a charged particle beam optical system in the electron optics device, comprising the steps of: extracting secondary particle signals resulting from a two-dimensional scan of a charged particle beam over a sample by the electron optics device; calculating a power spectrum by applying a two-dimensional Fourier transform to the secondary particle signals extracted by the extracting step; binarizing the power spectrum calculated by the calculating step to obtain a binarized image; obtaining a principal axis and an axis perpendicular to the principal axis of the binarized image obtained by the binarizing step; determining an intensity and a direction of the astigmatism by obtaining a distance between two points at which a sample image region in the binarized image intersects with the principal axis and a distance between two points at which the sample image region in the binarized image intersect with the axis perpendicular to the principal axis; and adjusting the stigmater of the charged particle beam optical system according to the intensity and the direction of the astigmatism determined by the determining step.

According to another aspect of the present invention there is provided an article of manufacture, comprising: a computer usable medium having computer readable program code means embodied therein for causing a computer to function as an astigmatism correction apparatus for correcting an astigmatism in an electron optics device by adjusting a stigmater of a charged particle optical system in the electron optics device, the computer readable program code means including: first computer readable program code means for causing said computer to extract secondary particle signals resulting from a two-dimensional scan of a charged particle beam over a sample by the electron optics device; second computer readable program code means for causing said computer to calculate a power spectrum by applying a two-dimensional Fourier transform to the secondary particle signals extracted by the first computer readable program code means; third computer readable program code means for causing said computer to binarize the power spectrum calculated by the second computer readable program code means to obtain a binarized image; fourth computer readable program code means for causing said computer to obtain a principal axis and an axis perpendicular to the principal axis of the binarized image obtained by the third computer readable program code means; fifth computer readable program code means for causing said computer to determine an intensity and a direction of the astigmatism by obtaining a distance between two points at which a sample image region in the binarized image intersects with the principal axis and a distance between two points at which the sample image region in the binarized image intersect with the axis perpendicular to the principal axis; and sixth computer readable program code means for causing said computer to control the electron optics device to adjust the stigmater of the charged particle beam optical system according to the intensity and the direction of the astigmatism determined by the fifth computer readable program code means.

According to another aspect of the present invention there is provided an astigmatism correction apparatus for correcting an astigmatism in an electron optics device by adjusting a stigmater of a charged particle beam optical system in the electron optics device, comprising: a first unit for adjusting a focal point of a lens system of the charged particle beam optical system according to a secondary particle signal image produced by extracting secondary particle signals resulting from a two-dimensional scan of a charged particle beam over a sample; and a second unit for correcting the astigmatism by adjusting the stigmater so as to make the astigmatism of the charged particle beam small according to the secondary particle signal image for which the focal point is adjusted by the first unit.

According to another aspect of the present invention there is provided an astigmatism correction method for correcting an astigmatism in an electron optics device by adjusting a stigmater of a charged particle beam optical system in the electron optics device, comprising: a first step for adjusting a focal point of a lens system of the charged particle beam optical system according to a secondary particle signal image produced by extracting secondary particle signals resulting from a two-dimensional scan of a charged particle beam over a sample; and a second step for correcting the astigmatism by adjusting the stigmater so as to make the astigmatism of the charged particle beam small according to the secondary particle signal image for which the focal point is adjusted by the first step.

According to another aspect of the present invention there is provided an article of manufacture, comprising: a computer usable medium having computer readable program code means embodied therein for causing a computer to function as an astigmatism correction apparatus for correcting an astigmatism in an electron optics device by adjusting a stigmater of a charged particle beam optical system in the electron optics device, the computer readable program code means including: first computer readable program code means for causing said computer to control the electron optics device to adjust a focal point of a lens system of the charged particle beam optical system according to a secondary particle signal image produced by extracting secondary particle signals resulting from a two-dimensional scan of a charged particle beam over a sample; and second computer readable program code means for causing said computer to control the electron optics device to correct the astigmatism by adjusting the stigmater so as to make the astigmatism of the charged particle beam small according to the secondary particle signal image for which the focal point is adjusted by an operation of the first computer readable program code means.

Other features and advantages of the present invention will become apparent from the following description taken in conjunction with the accompanying drawings.

BRIEF DESCRIPTION OF THE DRAWINGS

FIG. 9 is a diagram illustrating an exemplary 3×3 local averaging mask that can be used in a preliminary processing step in the flow chart of FIG. 8.

FIG. 10 is a diagram illustrating an exemplary binarized image that can be obtained by a binarization step in the flow chart of FIG. 8.

FIG. 11 is a diagram illustrating an exemplary labeled image that can be obtained by a labeling step in the flow chart of FIG. 8.

FIG. 13 is a table summarizing an example of actually calculated image moving amounts that can be obtained by a moving amount calculation step in the flow chart of FIG. 8.

DETAILED DESCRIPTION OF THE PREFERRED EMBODIMENTS

Referring now to FIG. 6 to FIG. 13, the first embodiment of the present invention will be described in detail. This first embodiment is directed to a method and an apparatus for realizing the automatic adjustment of the electron optics system in an electron optics device such as scanning electron microscope.

Figure 6:
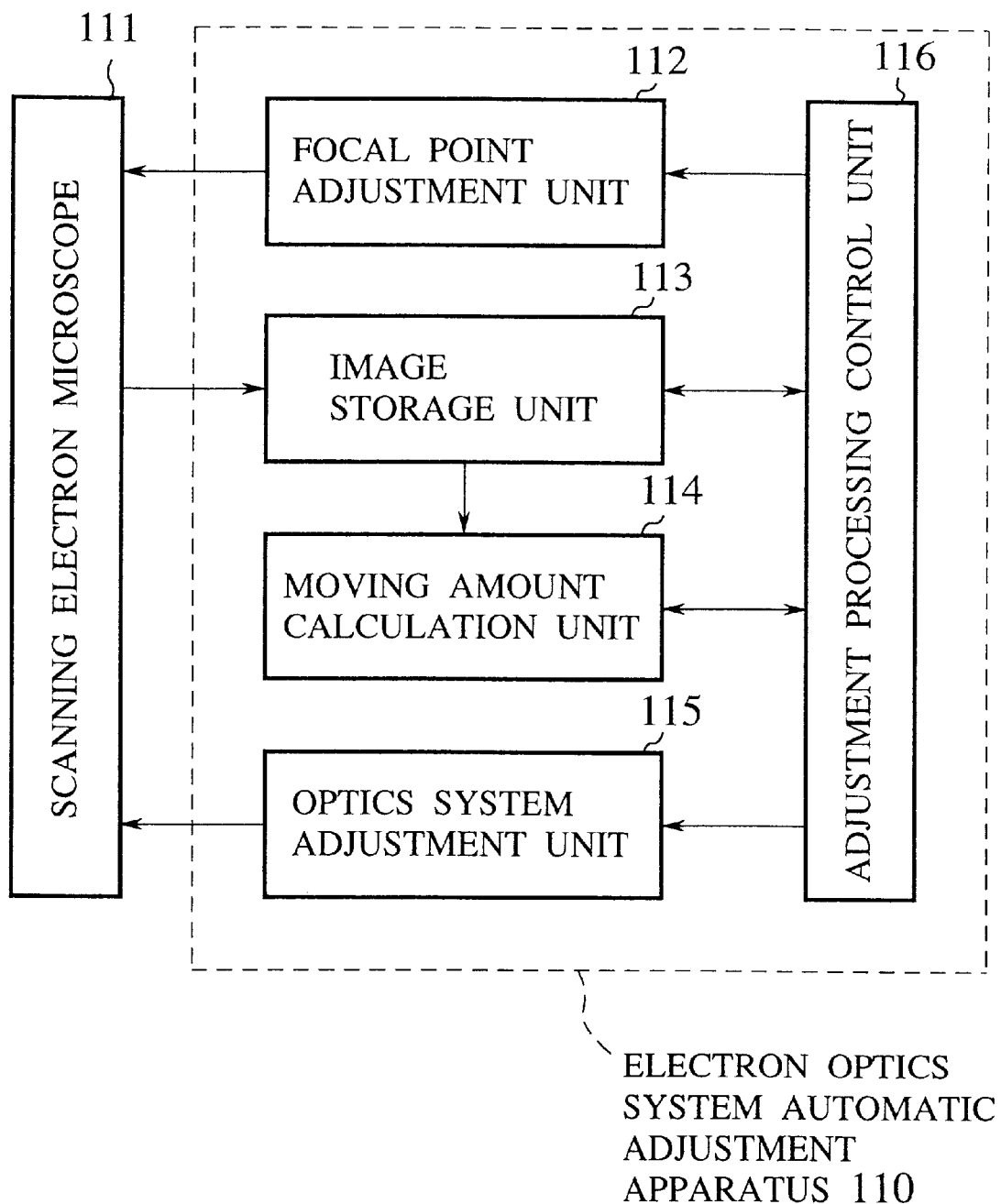
FIG. 6 is a schematic block diagram of an electron optics system automatic adjustment apparatus according to the first embodiment of the present invention.

FIG. 6 shows a configuration of an electron optics system automatic adjustment apparatus 110 in this first embodiment which is to be used in conjunction with a scanning electron microscope (SEM) 111. This electron optics system automatic adjustment apparatus 110 comprises a focal point adjustment unit 112, an image storage unit 113, a moving amount calculation unit 114, an optics system adjustment unit 115, and an adjustment processing control unit 116.

Figure 7:
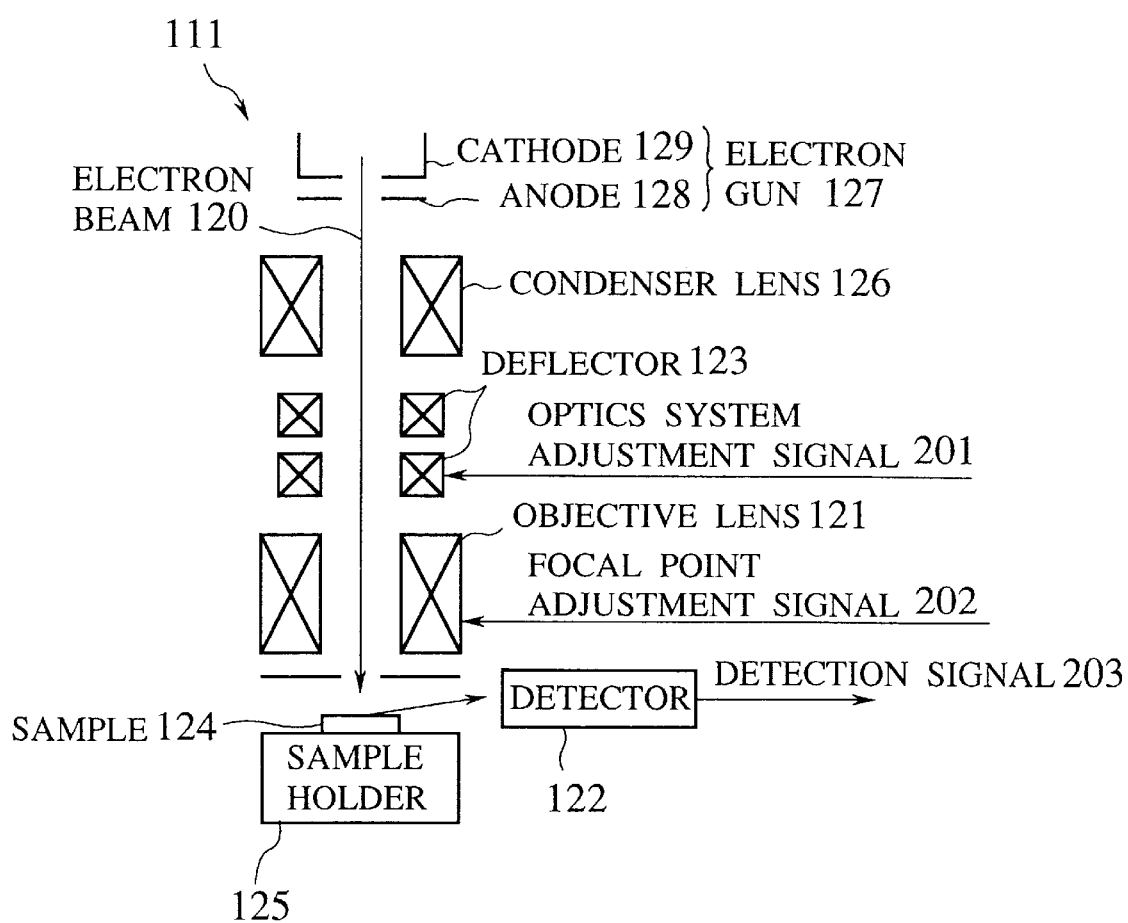
FIG. 7 is a schematic block diagram of a scanning electron microscope that can be used in conjunction with the electron optics system automatic adjustment apparatus of FIG. 6.

The SEM 111 is widely used in a variety of fields including the semiconductor inspection, for the purpose of inspecting the fine structure on a surface of a sample such as a semicondutor at high magnification. The SEM 111 has a schematic configuration as shown in FIG. 7, in which a field emission type electron gun 127 is formed by a cathode 129 and anode 128, and a high luminance electron beam 120 is emitted from this electron gun 127. The electron beam 120 is narrowed through a condenser lens 126 and an objective lens 121, and irradiated onto a surface of a sample 124. At this point, the secondary electrons emitted from the sample surface are detected by a detector 122. The electron beam 120 is two-dimensionally scanned over the sample 124 mounted on a sample holder 125 by means of a deflector 123.

The focal point adjustment unit 112 carries out the focal point adjustment by changing the refractive index of the objective lens 121 in the SEM 111. The image storage unit 113 stores a plural sets of images obtained by imaging a sample image from the detector 122 of the SEM 111 under the focal point adjustment made by the focal point adjustment unit 112. The moving amount calculation unit 114 calculates a moving amount of the sample image over an image field of a plurality of images stored in the image storage unit 113. The optics system adjustment unit 115 adjusts (corrects) the objective lens alignment by adjusting the electron optics system of the SEM 111. The adjustment processing control unit 116 controls an overall flow of the electron optics system adjustment processing with respect to the SEM 111.

As shown in FIG. 7, the focal point adjustment unit 112 outputs a focal point adjustment signal 202 under the control of the adjustment processing control unit 116, so as to carry out the objective lens 121 of the SEM 111. Also, the image storage unit 113 stores two dimensional gray scale images by A/D converting the detection signals 203 outputted from the detector 122 of the SEM 111. In addition, the optics system adjustment unit 115 outputs an optics system adjustment signal 201 under the control of the adjustment processing control unit 116, so as to carry out the alignment adjustment for the objective lens 121 by adjusting the deflector 123 in the SEM 111.

Here, when the alignment of the objective lens 121 is inaccurate in the SEM 111, the sample image moves within the image field when an operation to adjust the focal point with respect to the sample 124 (by adjusting the refractive index of the objective lens) is carried out. Consequently, the lens alignment adjustment amount can be determined from moving direction and amount of the sample image at a time of the focal point adjustment.

Then, by repeating the aperture stop position adjustment for the objective lens 121 until the sample image stops moving in the image field, it is possible to adjust the objective lens alignment accurately (that is, it is possible to make a correction to a correct position).

In order to determine the moving direction and amount of the sample image at a time of the focal point adjustment, it suffices to take images of the same sample while varying the focal point, and measure the moving amount of an image feature in relation to the focal point adjustment amount. To this end, it is necessary to realize an image processing method which is capable of tracing the image stably even when there is a blurring of the sample image due to the focal point adjustment.

In the following, the electron optics system automatic adjustment processing in this first embodiment will be described in detail.

The electron optics system automatic adjustment processing according to this first embodiment is carried out according to the flow chart of FIG. 8 as follows.

Here, it is assumed that N sets of focal point adjustment amounts Sn, i.e., S1, - - - , Sn, - - - , SN (n=1, - - - N), are provided in the adjustment processing control unit 116 in advance.

For each of these focal point adjustment amounts Sn, the focal point adjustment unit 112 adjusts the focal point of the objective lens 121 in the SEM 111 by each focal point adjustment amount Sn (step A11). Then, the sample 124 is imaged by the SEM 111 and an obtained image is sent to the image storage unit 113 (step A12).

The image I(n) obtained according to each focal point adjustment amount Sn and stored in the image storage unit 113 can be expressed as In(x, y) (x=1, - - - , X, y=1, - - - Y) where x (with a maximum value X) is the horizontal direction of the image field and y (with a maximum value Y) is the vertical direction of the image field.

The stored image In(x, y) is sequentially sent to the moving amount calculation unit 114 and a center of gravity position for each region in the image field is calculated as follows.

Namely, at the moving amount calculation unit 114, a preliminary processing defined by the following equation (1) is applied, so as to obtain a preliminary processed image I'n(x, y).

$$I'n(x, y) = F * In(x, y) \qquad (1)$$

where * denotes the convolution of a filter F.

This preliminary processing F realizes the noise removal processing for the purpose of preventing an overflow of label numbers in the labeling processing (step A15) after the removal of noise due to the imaging system, for example. The simplest example of this noise removal processing is a simple smoothing processing using the convolution of a 3×3 local averaging mask as shown in FIG. 9. In order to improve the noise removal performance, it is also possible to use the convolution of a mask in any desired size larger than 3×3 pixels, and it is also possible to use any desired weighting to a value of each pixel of the mask. It is also possible to realize the noise removal by using the statistical processing such as that of the median filter instead of the simple smoothing processing.

The preliminary processed image I'n(x, y) is then binarized by using a prescribed threshold th, so as to obtain a binarized image Jn(x, y) expressed by the following equation (2) (step A14).

$$Jn(x, y) = \begin{cases} 1 : In(x, y) > th \\ 0 : In(x, y) \leq th \end{cases} \qquad (2)$$

For the threshold th, a single threshold value may be prescribed for the entire image In, or different threshold values may be prescribed for different coordinate In(x, y) of the image.

The binarized image Jn(x, y) is then labeled as a connected region in the image field, so as to obtain a labeled region An(k) (k=1, - - -, kn) (step A15), where the maximum label number obtained for the image In(x, y) is denoted as kn. Here, the labeling processing is a well known processing for image conversion in which each independent connected image region is assigned with a single label number.

For instance, the binarized image as shown in FIG. 10 will be converted into the labeled image as shown in FIG. 11 by this labeling processing. In this example, the maximum label number kn is "3", and there are three labeled regions An(1), An(2) and An(3). In FIGS. 10 and 11, a part (a) depicts the obtained sample image, while a part (b) depicts a view in which the sample image is partitioned in units of pixels.

Then, x-coordinate Gx(k) and y-coordinate Gy(k) of the center of gravity position of each image region corresponding to each label An(k) are calculated by the following equation (3) and (4) respectively (step A16).

$$GXn(k) = \frac{In(x, y) \sum_{\subset An(k)} x}{In(x, y) \sum_{\subset An(k)} 1} \quad (3)$$

$$GYn(k) = \frac{In(x, y) \sum_{\subset An(k)} x}{In(x, y) \sum_{\subset An(k)} 1} \quad (4)$$

In practice, in order to realize the more accurate center of gravity position calculation, it is also possible to carry out the post processing for correcting the labeled image before the center of gravity position calculation. Examples of such a post processing include the hole filling processing in the labeled image and a feature value calculation processing using a geometrical central moment of second order after the hole filling processing. These processings are designed so that only the expected kinds of image features alone can be extracted as the label regions.

At the moving amount calculation unit 114, every time the image In(x, y) corresponding to the focal point adjustment amount Sn is stored in the image storage unit 113, the processing up to this center of gravity position calculation processing is carried out first, and the center of gravity positions GXn(k), GYn(k) for all labeled regions An(k) in the image In(x, Y) are stored. The above processing is repeated for all focal point adjustment amounts Sn that are set in the adjustment processing control unit 116, until the image taking at a prescribed focal point defined by the maximum focal point adjustment amount SN is finished (step A17).

Figure 12:
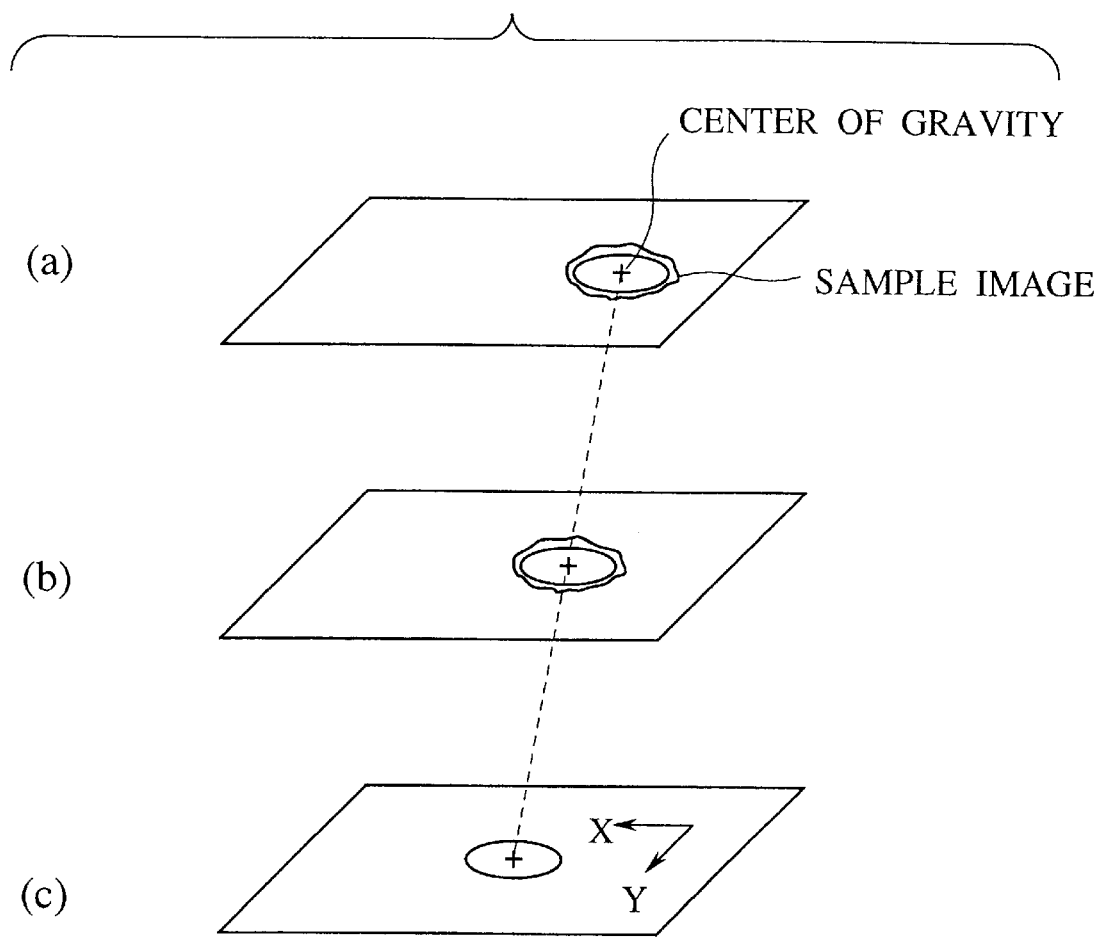
FIG. 12 is a diagram illustrating exemplary contact hole images and center of gravity calculation result that can be obtained by a center of gravity calculation step in the flow chart of FIG. 8.

In an exemplary case of using contact hole images that an be obtained in the inspection of a semiconductor such as LSI and the focal point adjustment amounts in three steps of −5 μm, 0 μm and +5 μm, exemplary contact hole images and center of gravity calculation result are as shown in FIG. 12. In this example, the center of gravity position is calculated for one contact hole according to the method described above.

After the image In(x, y) is obtained and the center of gravity position GXn(k), GYn(k) is calculated for all the preset focal point adjustment amounts Sn in this manner, the moving amount calculation unit 114 carries out the center of gravity tracing by establishing correspondences among those labeled regions which have the closest center of gravity positions in the images corresponding to different focal point adjustment amounts (step A18), and then carries out the processing to calculate the moving amount of the image corresponding to the focal point adjustment amount (step A19).

Here, the center of gravity tracing processing at the step A18 is carried out as follows.

Suppose that Sn and Sm are a set of two closest focal point adjustment amounts. For instance, when the preset focal point adjustment amounts are given in five steps of "−2", "−1", "0", "+1" and "+2", Sn and Sm can be "−2" and "−1", or "−1" and "0" or "0" and "+1", or "+1" and "+2". Then, for every combination of the labeled region An(k) and Am(k') corresponding to these focal point adjustment amounts Sn and Sm, a distance DXnm in a horizontal direction and a distance DYnm in a vertical direction are calculated by the following equations (5) and (6) respectively.

$$DXnm = |GXn(k) - GXm(k')| \quad (5)$$

$$DYnm = |GXn(k) - GYm(k')| \quad (6)$$

where k=1, - - -, kn and k'=1, - - -, km.

Also, the Euclidean distance Dnm between the labeled regions An(k) and Am(k') is calculated by the following equation (7).

$$Dnm = (DXnm^2 + DYnm^2)^{1/2} \quad (7)$$

Then, the corresponding labeled regions are selected to be those for which the distance Dnm is minimum among all combinations of An(k) and Am(k'). This processing for establishing the correspondence between the labeled regions is carried out for all combinations of closest focal point adjustment amounts Sn and Sm, so as to establish the correspondences among all the labeled regions obtained from all the images stored in the image storage unit 113.

Next, the moving amount calculation processing at the step A19 is carried out as follows.

Here, it is assumed that An(k) and Am(k') are a set of labeled regions which are set in correspondence by the step A18. Similarly as in the step A18, the distances DXnm and DYnm in the horizontal and vertical directions between Sn and Sm are obtained by the above equations (5) and (6). These distances DXnm and DYnm are already calculated at the step A18 so that the values calculated by then may be stored in the moving amount calculation unit 114 and utilized at this step A19 again. Then, assuming that the focal point adjustment amounts Sn are set in equal intervals, as in the above described exemplary case of using the focal point adjustment amounts in five steps of "−2", "−1", "0", "+1" and "+2", and that a total number of sets of labeled regions An(k) and Am(k') that are set in correspondence is Na, the image moving amounts Tx and Ty in the horizontal and vertical directions of the image per unit focal point adjustment amount can be obtained by the following equations (8) and (9) respectively.

$$Tx = \frac{\sum_{\forall(Sn,Sm)} DXnm}{Na} \quad (8)$$

$$Ty = \frac{\sum_{\forall(Sn,Sm)} DYnm}{Na} \quad (9)$$

An example of actually calculated image moving amounts Tx and Ty is shown in FIG. 13, where values indicate the moving amount calculation results for six contact hold images. From this calculation result of FIG. 13, it can be seen that the sample image has moved for 17.12 pixels to the left (in the horizontal direction x) and 30.74 pixels downward (in the vertical direction y) on average when the focal point adjustment of −5 µm→0 µm is made, while the sample image has moved for 14.15 pixels to the left (in the horizontal direction x) and 25.45 pixels downward (in the vertical direction y) on average when the focal point adjustment of 0 µm→+5 µm is made, so that the average image moving amounts Tx and Ty are 15.64 pixels to the left and 28.10 pixels downward.

Finally, at the adjustment processing control unit 116, whether the adjustment of the electron optics system in the SEM 111 is necessary or not is judged (step A20). Here, this judgement is made according to the condition given by the following inequalities (10), that is, whether the image moving amounts Tx and Ty calculated by the step A19 are less than prescribed tolerable moving amounts Cx and Cy respectively or not.

$$Tx < Cx, \ Ty < Cy \qquad (10)$$

When both of the image moving amounts Tx and Ty are less than the respective tolerable moving amounts so that the condition of the inequalities (10) is satisfied, it is judged that the adjustment of the electron optics system is unnecessary (step A20 NO), and the processing is terminated.

On the other hand, when at least one of the image moving amounts Tx and Ty is not less than the corresponding tolerable moving amount, it is judged that the adjustment of the electron optics system is necessary (step A20 YES), and the electron optics system of the SEM 111 is adjusted by the optics system adjustment unit 115 according to the image moving amounts Tx and Ty calculated at the step A19 (step A21). Thereafter, the entire processing as described above is repeated.

In the optics system adjustment unit 115, the prescribed adjustment amounts for some lens or the deflector 123 in the SEM 111 are set in correspondence to the image moving amounts Tx and Ty. For example, the adjustment amount 0i for some lens or the deflector 123 may be set in terms of a suitable function G as expressed in the following equation (11).

$$0i = G(Tx, Ty) \qquad (11)$$

Alternatively, the adjustment amount 0i may be given in correspondence to each set of Tx and Ty in a form of a table.

Figure 8:
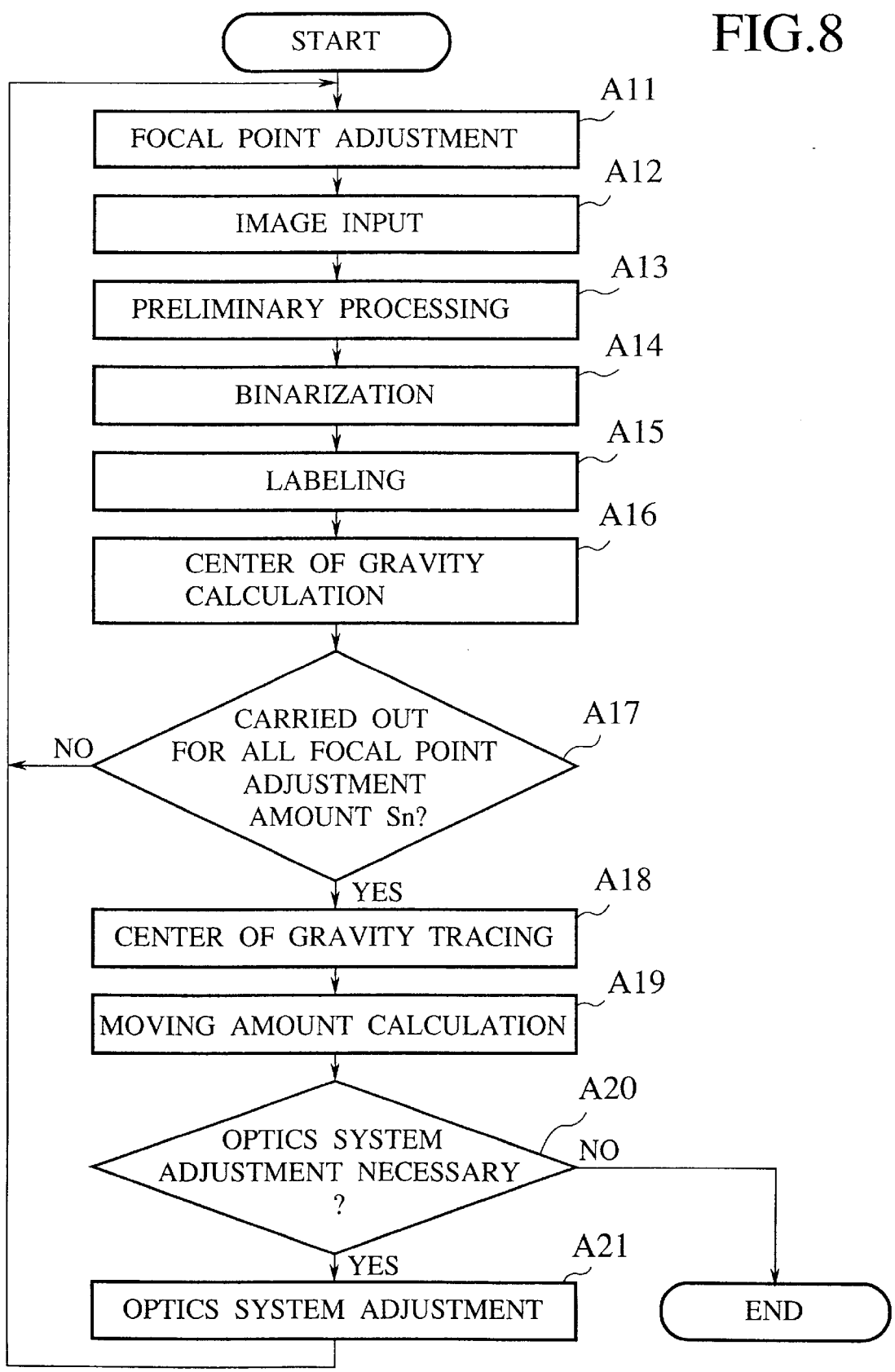
FIG. 8 is a flow chart for an electron optics system automatic adjustment processing according to the first embodiment of the present invention.

In this manner, the processing of FIG. 8 is repeated until it is judged that the image moving amounts Tx and Ty are both less than the respective tolerable values at the step A20, so that it becomes possible to automatically adjust the electron optics system of the SEM 111.

As a concrete example, consider a case of using the three step focal point adjustment in which three images as shown in FIG. 12 are sequentially obtained by the SEM 111. Note that a number of focal point adjustment steps in this case corresponds to a number of images taken until the image taking reaches to a prescribed focal point as judged at the step A17 of FIG. 8.

The moving amount of the sample image is obtained by calculating the center of gravity position of the sample image appearing in the obtained images and tracing the calculated center of gravity position. As described above, when the moving amount of the sample image is less than the tolerable value at this point, that is, when it is in a state where the sample image does not move in relation to the focal point adjustment, it implies that lens alignment is already accurate at that point, so that it is judged that the adjustment of the electron optics system is unnecessary and the processing is terminated at that point.

On the other hand, when the moving amount of the sample image is greater than or equal to the tolerable value at this point, that is, when it is in a state where the sample image moves in relation to the focal point adjustment, it implies that the lens alignment is still not accurate at that point, so that it is judged that the adjustment of the electron optics system is necessary and, after the adjustment is carried out, the processing is repeated from the step A11 again.

By processing the images obtained by the SEM 111 in this manner, it is possible to automatize the electron optics system adjustment operation. In this case, as shown in a part (a) or (b) of FIG. 12, the sample image is blurred when the focal point is not at an optimal focus position where the image is sharply focused. Usually, the correct moving amount cannot be calculated when the sample image is blurred so that the lens alignment becomes difficult, but according to the present invention, it is possible to adjust the lens alignment regardless of the blurring of the sample image.

Note that, in this first embodiment, the center of gravity position of the sample image is subjected to the tracing, but it is also possible to use a central position of the sample image instead, for example. In essence, it suffices to be able to calculate the moving amount of the sample image by specifying a position that can be used as a reference and tracing that position.

Referring now to FIG. 14 to FIG. 18, the second embodiment of the present invention will be described in detail. This second embodiment is also directed to a method and an apparatus for realizing the automatic adjustment of the electronic optics system in an electron optics device such as scanning electron microscope.

In this second embodiment, a configuration of the electron optics system automatic adjustment apparatus is substantially the same as that of FIG. 6 for the first embodiment, so that its detailed description will not be repeated here.

Figure 14:
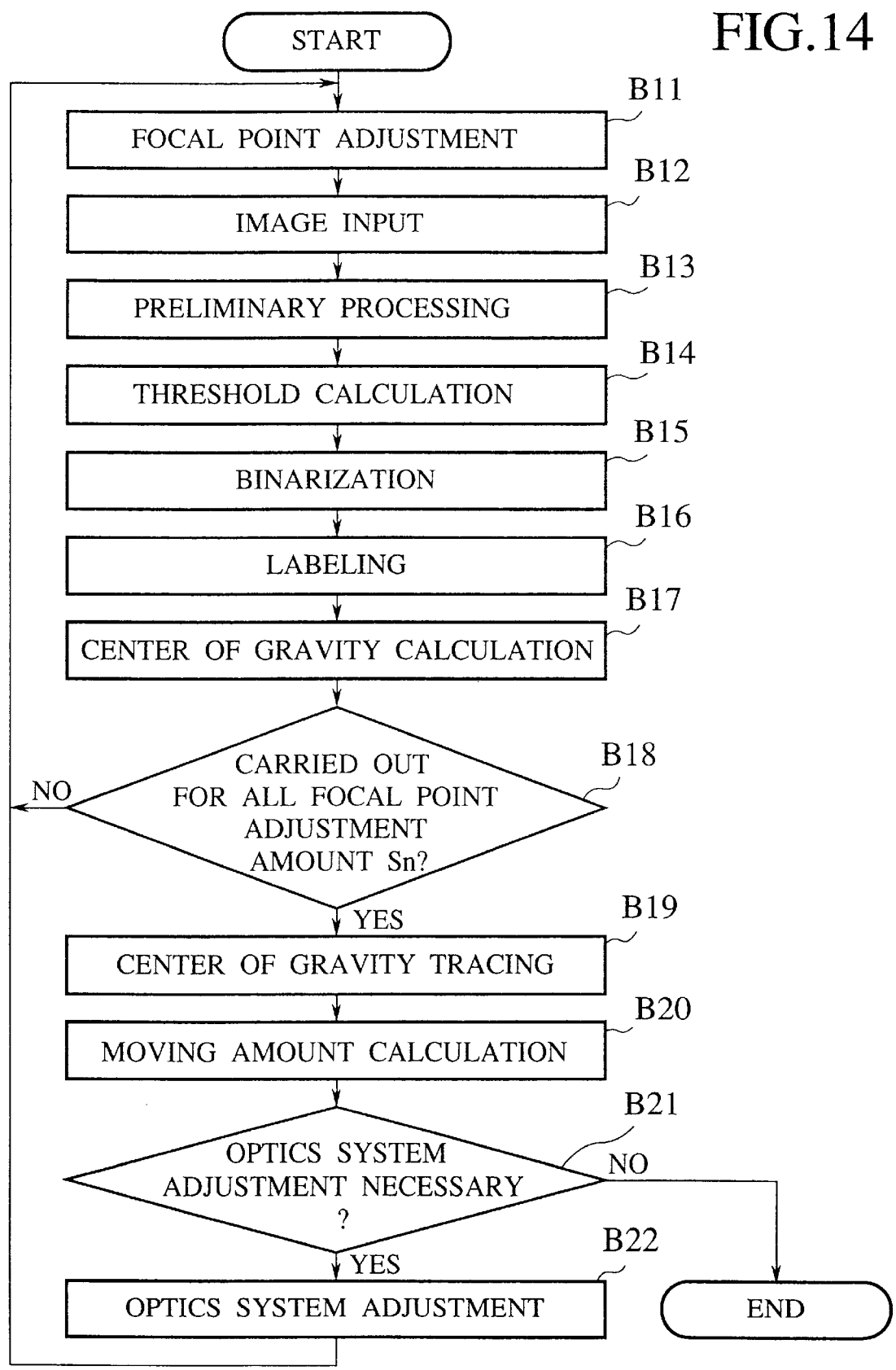
FIG. 14 is a flow chart for an electron optics system automatic adjustment processing according to the second embodiment of the present invention.
Figure 15:
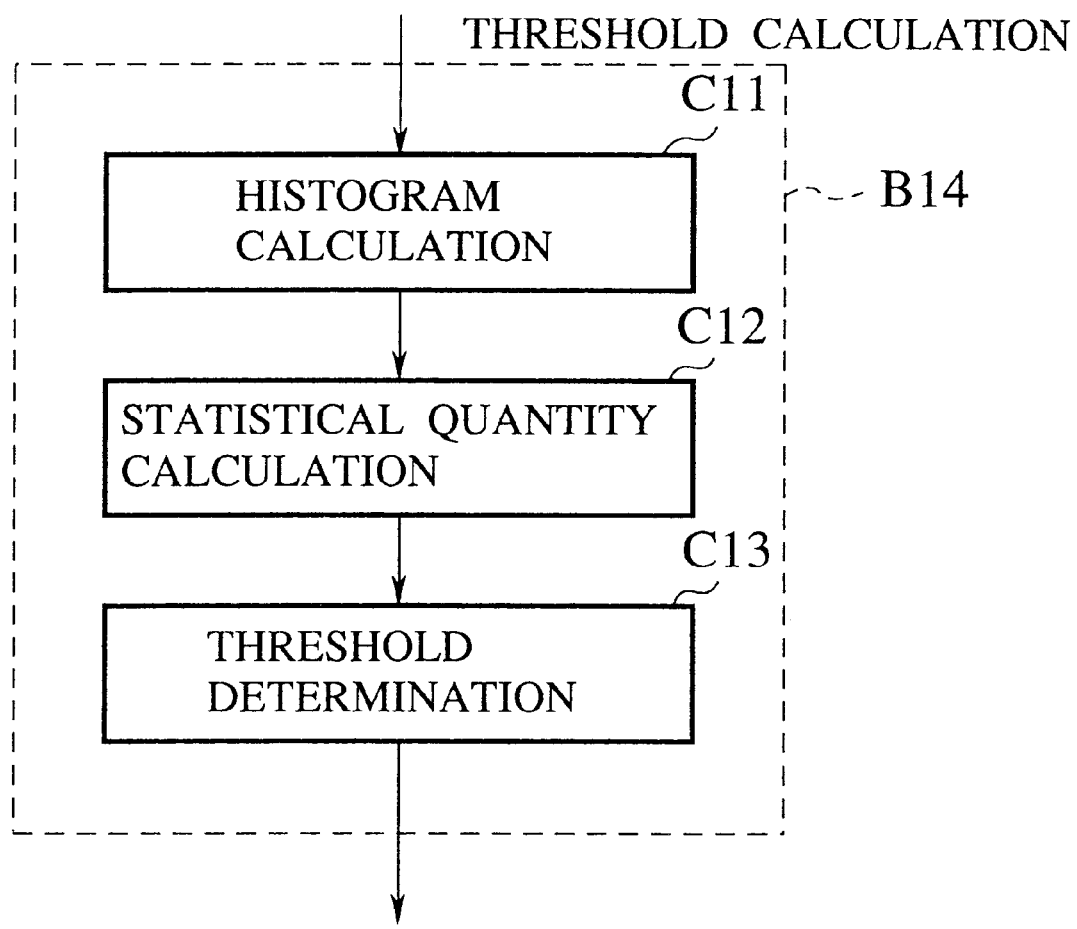
FIG. 15 is a flow chart for a detailed processing of a threshold calculation step in the flow chart of FIG. 14.

The electron optics system automatic adjustment processing according to this second embodiment is carried out according to the flow chart of FIG. 14. Here, this processing of FIG. 14 differs from that of FIG. 8 for the first embodiment in that a threshold calculation processing of the step B14 at the moving amount calculation unit 114 is additionally included. The other steps of FIG. 14 are substantially the same as the corresponding steps in FIG. 8, so that their detailed description will not be repeated here.

Namely, in the first embodiment described above, it is assumed that the threshold th used in the binarization processing (step A14 of FIG. 8) for the image I'n(x, y) is prescribed. However, in order to make it possible to extract the labeled regions correctly even when the image is blurred due to the focal point adjustment, there are cases in which it is more effective to determine the optimum threshold th by carrying out the statistical processing according to the imaged sample image.

To this end, this second embodiment includes the threshold calculation processing (step B14) as a preliminary processing of the binarization processing (step B15) for the input image. The concrete processing of this threshold calculation processing (step B14) is carried out according to the flow chart of FIG. 15 as follows.

Here, it is assumed that an image region Rn(x, y) for the purpose of calculating the threshold is defined in advance for each pixel I'n(x, y) of the sample image after the preliminary processing (step B13). This image region can be set arbitrarily. For example, this image region can be set as a 15×15 pixel rectangular region centered around the pixel (x, y), or as an entire image In. When the entire image is specified, the threshold thn(x, y) obtained by the following processing will take a constant value within the image irrespective of coordinates.

First, a histogram calculation for image concentration values within the image region Rn(x, y) of each pixel In(x, y) is carried out (step C11). For the sake of simplicity, only the processing for one image region Rn(x, y) will be described in the following, and an obtained histogram value (frequency of occurrences) for each concentration value i will be denoted as hi. Here, in a case where the SEM 111 is capable of obtaining the 8 bit gray scale image, this gray scale image has the 256 steps concentration value i for which the minimum value is "1" and the maximum value imax is "255".

Then, from the histogram value hi obtained at the step C11, statistical quantities necessary at the following threshold determination step C13 are calculated by the statistical quantity calculation processing (step C12). Here, the threshold calculation method based on a method called discriminant analysis method or Otsu's method will be described.

First, a probability distribution pi of the concentration value i is obtained from the histogram value hi according to the following equation (12):

$$pi = hi/Nr \quad (12)$$

where Nr is a total number of pixels in the image region Rn(x, y).

Then, sums of probability in a class $\omega 0$ and $\omega 1$ are obtained according to the following equations (13) and (14) respectively.

$$\omega 0 = \sum_{i=1}^{k} pi \quad (13)$$

$$\omega 1 = \sum_{i=k+1}^{imax} pi \quad (14)$$

Then, means in a class $\mu 0$ and $\mu 1$ and a total mean $\mu t$ are obtained according to the following equations (15), (16) and (17) respectively.

$$\mu 0 = \sum_{i=1}^{k} i \cdot pi / \omega 0 \quad (15)$$

$$\mu 1 = \sum_{i=k+1}^{imax} i \cdot pi / \omega 1 \quad (16)$$

$$\mu t = \sum_{i=1}^{imax} i \cdot pi \quad (17)$$

In the above, the sums of probability in a class $\omega 0$ and $\omega 1$ and the means in a class $\mu 0$ and $\mu 1$ are obtained for all possible values of k. Then, for each value of k, a variance between classes E(k) is obtained according to the following equation (18).

$$E(k) = \omega 0 (\mu 0 - \mu t)^2 + \omega 1 (\mu 1 - \mu t)^2 \quad (18)$$

Finally, at the threshold calculation step C13, a value of k for which the variance between classes E(k) obtained by the step C12 takes the maximum value is outputted as the optimum binarization threshold thn(x, y) for that image region Rn(x, y). Then, the optimum binarization image Jn(x, y) can be obtained according to the following equation (19) at the subsequent binarization processing (step B15).

$$Jn(x, y) = \begin{cases} 1 : In(x, y) > thn(x, y) \\ 0 : In(x, y) \leq thn(x, y) \end{cases} \quad (19)$$

Figure 16:
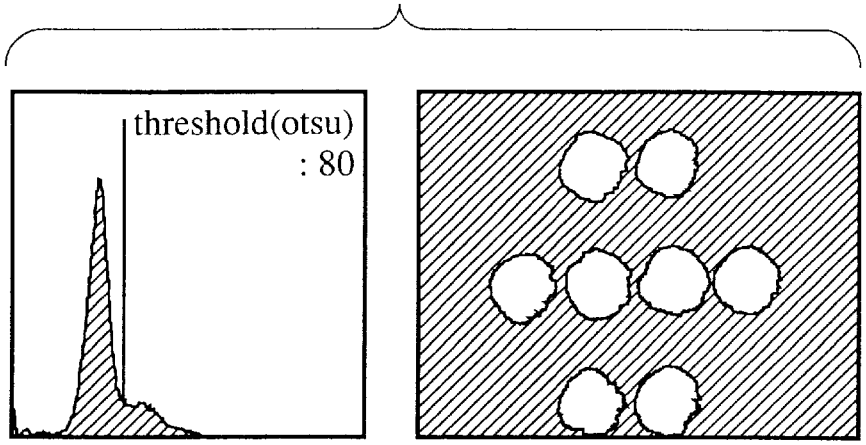
FIG. 16 is a diagram illustrating one exemplary binarization threshold calculation result and binarization image obtained by a threshold calculation step and a binarization step in the flow chart of FIG. 14.
Figure 17:
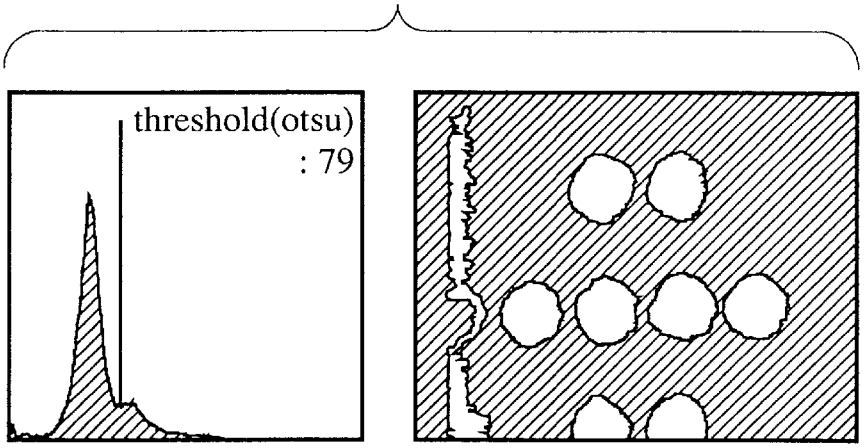
FIG. 17 is a diagram illustrating another exemplary binarization threshold calculation result and binarization image obtained by a threshold calculation step and a binarization step in the flow chart of FIG. 14.
Figure 18:
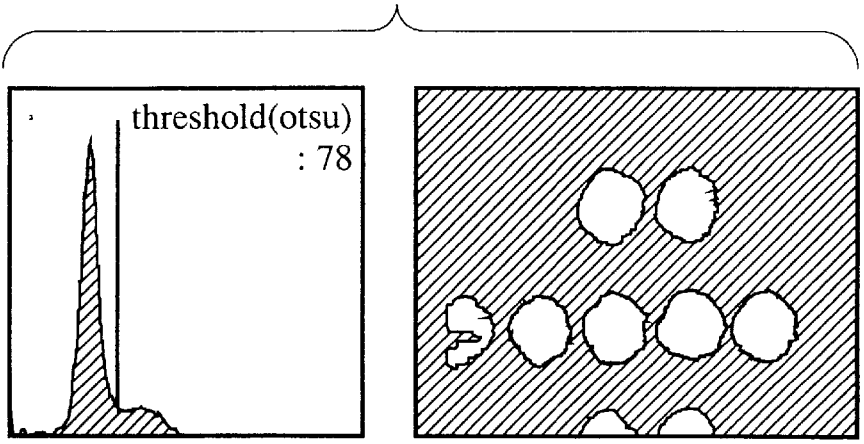
FIG. 18 is a diagram illustrating another exemplary binarization threshold calculation result and binarization image obtained by a threshold calculation step and a binarization step in the flow chart of FIG. 14.

Here, the exemplary binarization threshold calculation results and binarization images obtained in an exemplary case of using the focal point adjustment amounts in three steps of $-5 \mu m$, $0 \mu m$ and $+5 \mu m$ are shown in FIGS. 16, 17 and 18 for the respective focal point adjustment amounts. In this example, the image region Rn(x, y) for each pixel (x, y) is set as the entire image In, so that the threshold thn(x, y) takes a single value for one image.

Note that the threshold determination method described above is based on the Otsu's method, but this second embodiment is not limited to this particular method, and there are cases in which the Kittler's method to be described below is effective, when the labeled image has a very small area compared with the entire image.

In the Kittler's method, the sums of probability in a class $\omega 0$ and $\omega 1$ are obtained by the statistical quantity calculation processing (step C12) similarly as in the above, and then variances in a class $\sigma 0$ and $\sigma 1$ corresponding to the sums of probability in a class $\omega 0$ and $\omega 1$ are obtained. Then, a value of k for which the statistical quantity E'(k) defined by the following equation (20) takes the minimum value is outputted as the optimum binarization threshold thn(x, y) by the threshold determination processing (step C13).

$$E'(k) = \omega 0 \log(\sigma 0/\omega 0) + \omega 1 \log(\sigma 1/\omega 1) \quad (20)$$

In this manner, according to this second embodiment, the threshold for the binarization processing is calculated by carrying out the statistical processing on a plurality of images, and each image is binarized by using the calculated threshold, so that the labeled region can be extracted correctly and therefore a high precision optics system adjustment can be realized even when the image is blurred due to the focal point adjustment.

Figure 19:
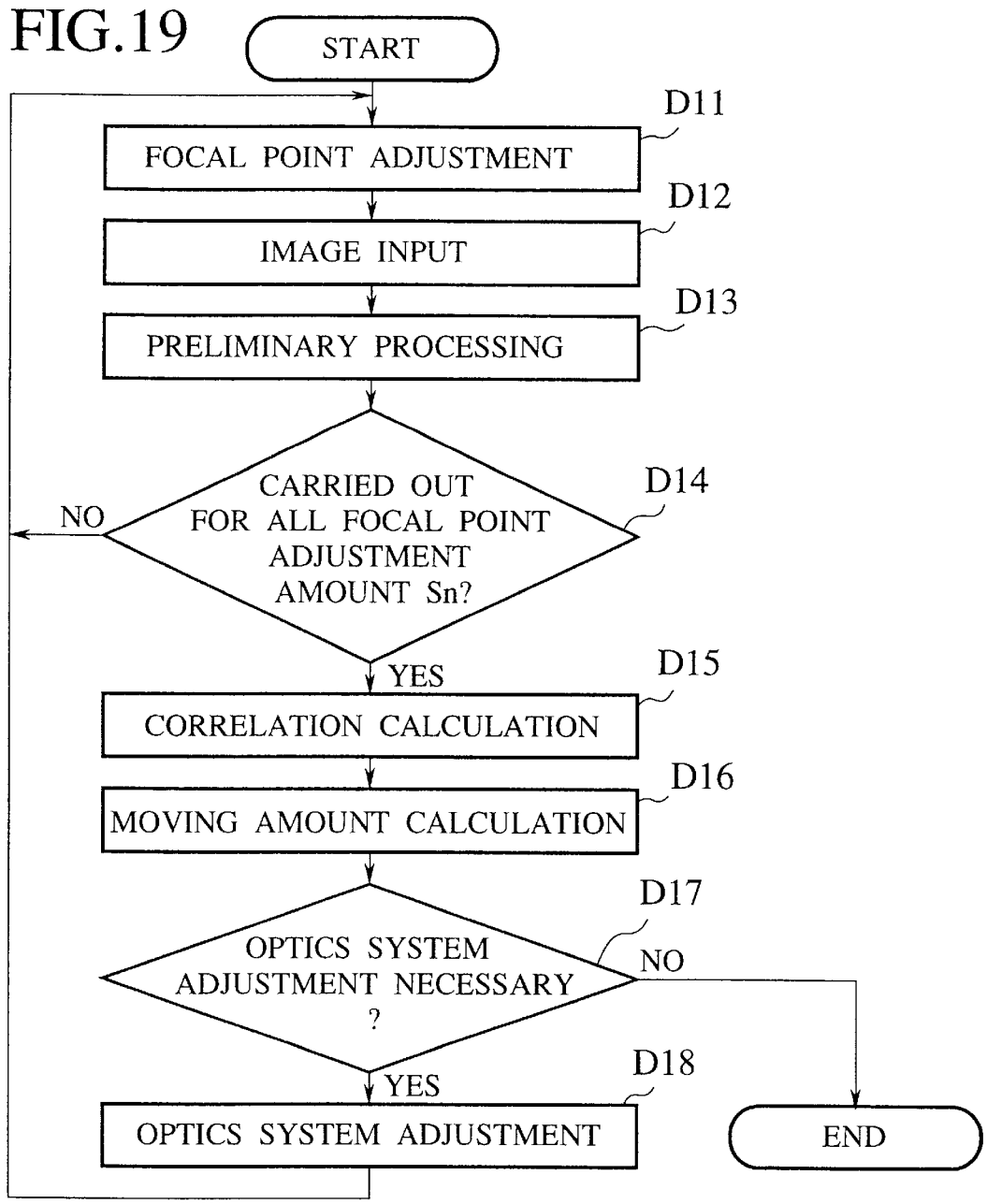
FIG. 19 is a flow chart for an electron optics system automatic adjustment processing according to the third embodiment of the present invention.
Figure 20:
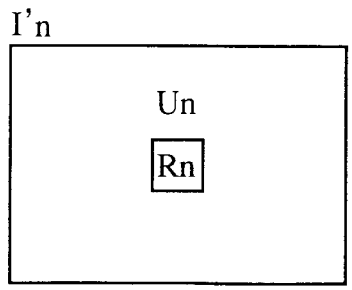
FIG. 20 is a diagram illustrating an image region and a search region used in a correlation calculation step in the flow chart of FIG. 19.

Referring now to FIG. 19 and FIG. 20, the third embodiment of the present invention will be described in detail. This third embodiment is also directed to a method and an apparatus for realizing the automatic adjustment of the electron optics system in an electron optics device such as scanning electron microscope.

In this third embodiment, a configuration of the electron optics system automatic adjustment apparatus is substantially the same as that of FIG. 6 for the first embodiment, so that its detailed description will not be repeated here.

The electron optics system automatic adjustment processing according to this third embodiment is carried out according to the flow chart of FIG. 19. In this processing of FIG. 19, the steps D11, D12, D13, D14, D17 and D18 are substantially the same as the corresponding steps in FIG. 8, so that their detailed description will not be repeated here.

Instead of the binarization processing and the center of gravity position calculation after the preliminary processing as used in the first embodiment, this third embodiment uses a processing for calculating the moving amounts of the sample image with respect to the focal point adjustments (step D16) and a processing for calculating a correlation between image regions (step D15) which will be used in the step D16, and these processings are carried out as follows.

Suppose that the processing up to the step D14 is completed and a prescribed number of preliminary processed images I'n(x, y) are stored in the image storage unit 113. In addition, it is assumed that the focal point adjustment amounts Sn are set in equal intervals and Sn and Sm are a set of two closest focal point adjustment amounts just as in the first embodiment described above.

In this third embodiment, the image moving amounts Tx and Ty are calculated such that the correlation between the images I'n and I'm obtained in correspondence to the focal point adjustment amounts Sn and Sm becomes highest, and these image moving amounts are used as references for the optics system adjustment by the optics system adjustment unit 115 at the step D18.

Here, it is assumed that, in the image I'n obtained by applying the preliminary processing to the sample image In obtained in correspondence to the focal point adjustment amount Sn, an image region Rn and a search region Un as shown in FIG. 20 are set up in advance. In FIG. 20, the image region Rn and the search region Un are depicted as rectangular regions, but these regions can be set up in arbitrary shapes at arbitrary positions, and both of them can be set as the entire image if desired.

At the correlation calculation processing (step D15), a statistical quantity indicating a level of correlation between regions is calculated for the image region Rn that is set in the sample image I'n for the focal point adjustment amount Sn and an arbitrary image region Rm contained in the search region Um that is set in the image I'm for the focal point adjustment amount Sm.

For example, by defining a reference coordinate (x1, y1) of the image region Rn and a reference coordinate (x2, y2) of the image region Rm, a residue θ can be calculated according to the following equation (21).

$$\theta = \sum_x \sum_y |I'n(x1 + x, y1 + y) - I'm(x2 + x, y2 + y)| \quad (21)$$

$(x, y | \forall\ I'n(x1 + x, y1 + y) \in Rn\ \text{and}\ \forall\ I'm(x2 + x, y2 + y) \in Rn)$ Among the known methods that utilizes such a residue θ, there is a method called SSDA method which requires less computational cost and which is therefore convenient for the purpose of obtaining the correlation level. It is also possible to obtain the true mutual correlation coefficient C between Rn and Rm. This correlation calculation is carried out between one Rn and every Rm contained in Um.

Next, at the moving amount calculation processing (step D16), when the residue θ is obtained by the step D15 for example, R'm for which the residue θ with respect to the image region Rn is the smallest is obtained. Then, the image moving amounts Tx and Ty between the focal point adjustment amounts Sn and Sm can be calculated as differences between x and y coordinate values between the reference coordinates (x1, y1) and (x2, y2) of the image regions Rn and R'm according to the following equations (22) and (23) respectively.

$$Tx = x1 - x'2 \quad (22)$$

$$Ty = y1 - y'2 \quad (23)$$

These image moving amounts Tx and Ty are calculated for every pair of the focal point adjustment amounts Sn and Sm, and the total average values of all the obtained Tx and Ty are outputted as the image moving amounts.

Note that, for each of the image region Rn and the search region Un, more than one regions may be set up with respect to one image I'n, and in such a case, the total average values of all the obtained Tx and Ty for all these regions can be outputted as the image moving amounts by the moving amount calculation unit 114, and used as indices for the optics system adjustment by the optics system adjustment unit 115 at the step D18.

In this manner, according to this third embodiment, the moving amounts of the sample image are obtained by carrying out the correlation calculation between a plurality of images, so that the center of gravity position calculation and the center of gravity tracing processing as required in the first embodiment are not necessary, and the moving amounts of the sample image can be obtained relatively easily.

Figure 21:
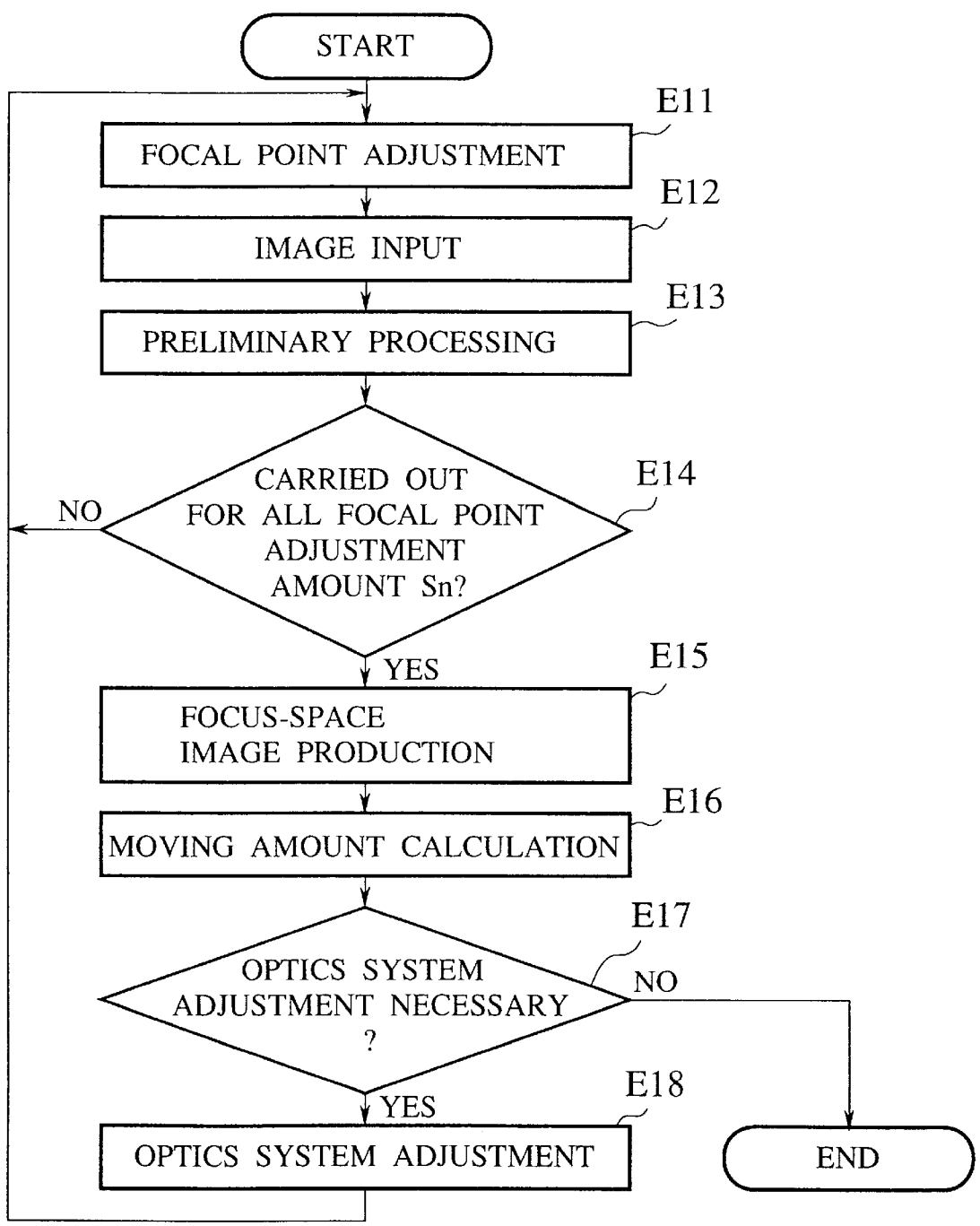
FIG. 21 is a flow chart for an electron optics system automatic adjustment processing according to the fourth embodiment of the present invention.
Figure 22:
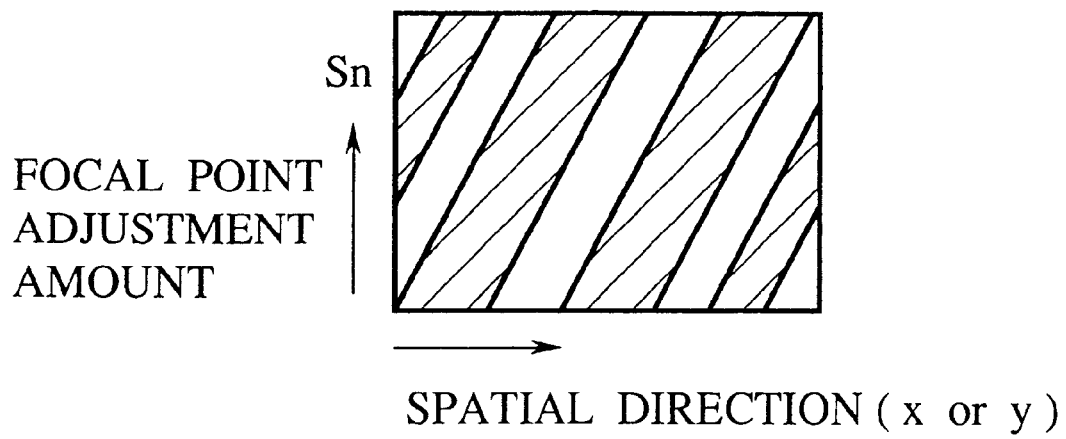
FIG. 22 is a diagram illustrating a focus-space image obtained by a focus-space image production step in the flow chart of FIG. 21.
Figure 23:
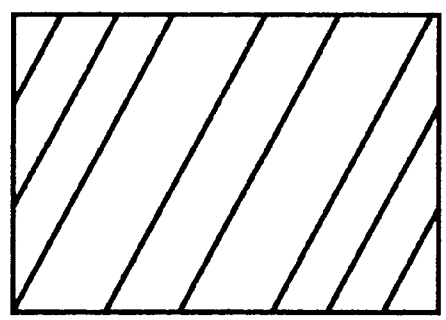
FIG. 23 is a diagram illustrating linear edges of a focus-space image obtained by a moving amount calculation step in the flow chart of FIG. 21.

Referring now to FIG. 21 to FIG. 23, the fourth embodiment of the present invention will be described in detail. This fourth embodiment is also directed to a method and an apparatus for realizing the automatic adjustment of the electron optics system in an electron optics device such as scanning electron microscope.

In this fourth embodiment, a configuration of the electron optics system automatic adjustment apparatus is substantially the same as that of FIG. 6 for the first embodiment, so that its detailed description will not be repeated here.

The electron optics system automatic adjustment processing according to this fourth embodiment is carried out according to the flow chart of FIG. 21. In this processing of FIG. 21, the steps E11, E12, E13, E14, E17 and E18 are substantially the same as the corresponding steps in FIG. 8, so that their detailed description will not be repeated here.

Instead of the binarization processing and the center of gravity position calculation after the preliminary processing as used in the first embodiment, this fourth embodiment uses a processing for calculating the moving amounts of the sample image with respect to the focal point adjustment (step E16) and a processing for producing a focus-space image (step E15) which is to be used in the step E16, and these processings are carried out as follows.

Suppose that the processing up to the step E14 is completed and a prescribed number of preliminary processed images I'n(x, y) are stored in the image storage unit 113. In addition, it is assumed that the focal point adjustment amounts Sn are set in equal intervals. At this point, it is possible to produce an image as shown in FIG. 22 in which the horizontal axis is the x-coordinate and the vertical axis is the focal point adjustment amount Sn, by arranging an image portion having a specific y-coordinate value in each image I'n(x, y), that is, a slit image of one horizontal line corresponding to a specific y-coordinate value, sequentially in an order of n along the vertical direction. Such an image will be referred to as the focus-space image. It is also possible to produce the focus-space image for the y direction similarly by aligning a slit image of one vertical line corresponding to a specific x-coordinate value along the horizontal direction and arranging the aligned slit image sequentially in an order of n along the vertical direction. In this manner, the focus-space image production processing (step E15) produces two focus-space images for x and y coordinates that are set up in advance.

Then, from the focus-space images so produced, the moving amounts Tx and Ty of the sample image with respect to the focal point adjustment amount are calculated as follows (step E16).

First, by applying the spatial differentiation processing such as that of the Sobel operator to each of the two focus-space images, linear edges caused by the focal point adjustment alone are extracted as shown in FIG. 23. Then, by using the processing such as the Hough transformation which obtains a slope of the straight line portion in the image, all slopes bi of a plurality of straight lines contained in each focus-space image are obtained, and a total average value b of bi is obtained.

This average slope b (an average value of slops of straight line portions in the image of FIG. 23) indicates the moving amount in the x-direction or the y-direction of the sample image with respect to the unit focal point adjustment amount. Consequently, the average slope b obtained from the focus-space image for the x-direction is outputted as Tx and the average slop b obtained from the focus-space image for the y-direction is outputted as Ty, by the moving amount calculation unit 114, and used as references for the optics system adjustment by the optics system adjustment unit 115 at the step E18.

In this manner, according to this fourth embodiment, the moving amounts of the sample image are obtained from the focus-space images which are produced from a plurality of images plurality of images, so that the center of gravity position calculation and the center of gravity tracing processing as required in the first embodiment are not necessary, and the moving amounts of the sample image can be obtained relatively easily.

As described, according to the first to fourth embodiments described above, it is possible to automatize the electron optics system adjustment operation by additionally providing a device for processing images obtained from the SEM. As a consequence, it is possible to resolve the conventionally encountered problems that the electron optics system adjustment operation in the SEM has been a kind of operation that requires skills and it has been impossible for a general user to carry out this adjustment operation, and that the throughput of the inspection has been lowered because of the electron optics system adjustment operation during the semiconductor inspection process. Thus, according to a method and an apparatus for realizing the automatic adjustment of the electron optics system in an electron optics device such as scanning electron microscope according to the present invention, there are considerable practical advantages in that a work load on the operator can be reduced while the throughput of the process such as the semiconductor inspection can be improved considerably.

Referring now to FIG. 24 to FIG. 29, the fifth embodiment of the present invention will be described in detail. This fifth embodiment is directed to a method and an apparatus for realizing the astigmatism correction in a charged particle beam optical system of an electron optics device such as scanning electron microscope.

Figure 1:
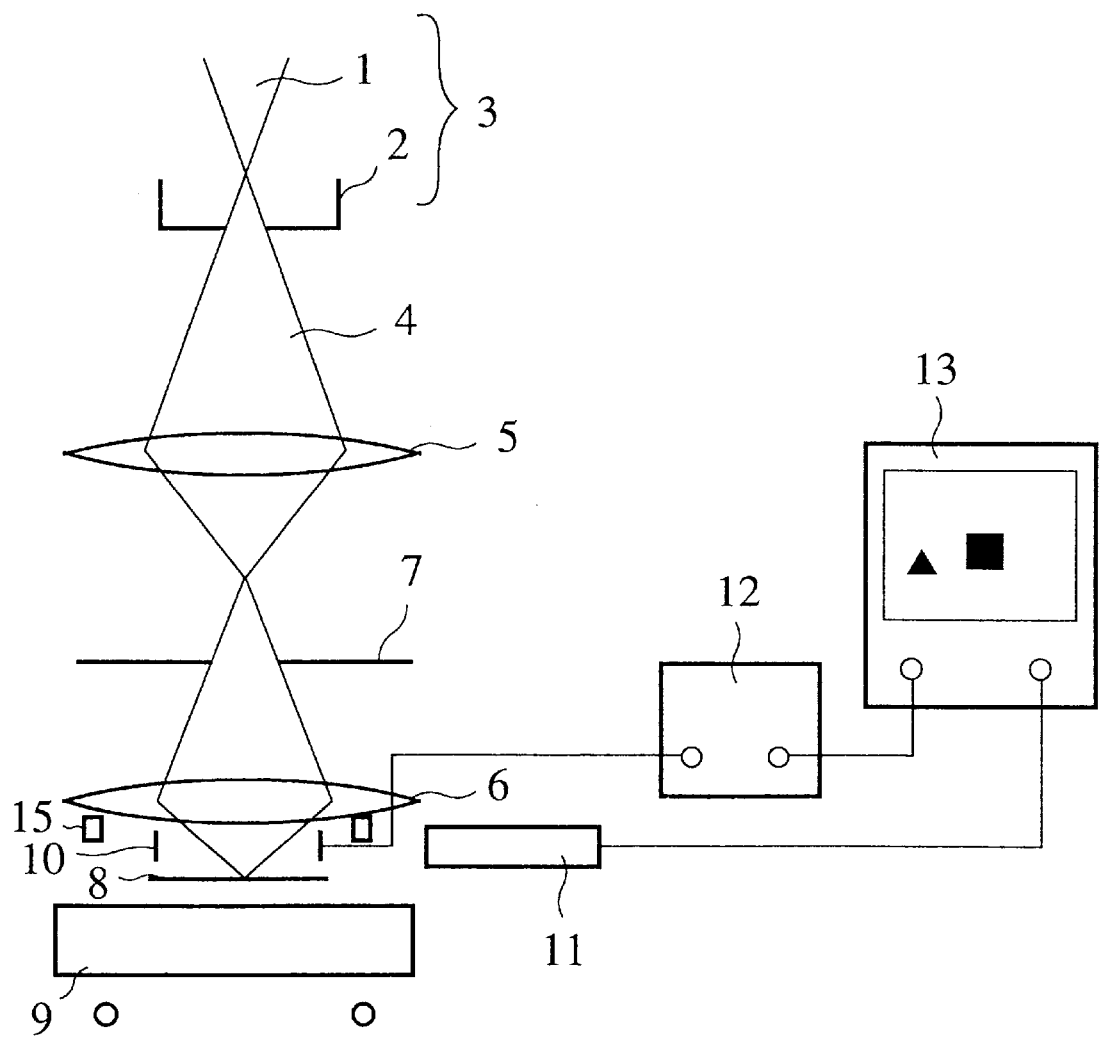
FIG. 1 is a schematic block diagram of a conventional scanning electron microscope.
Figure 24:
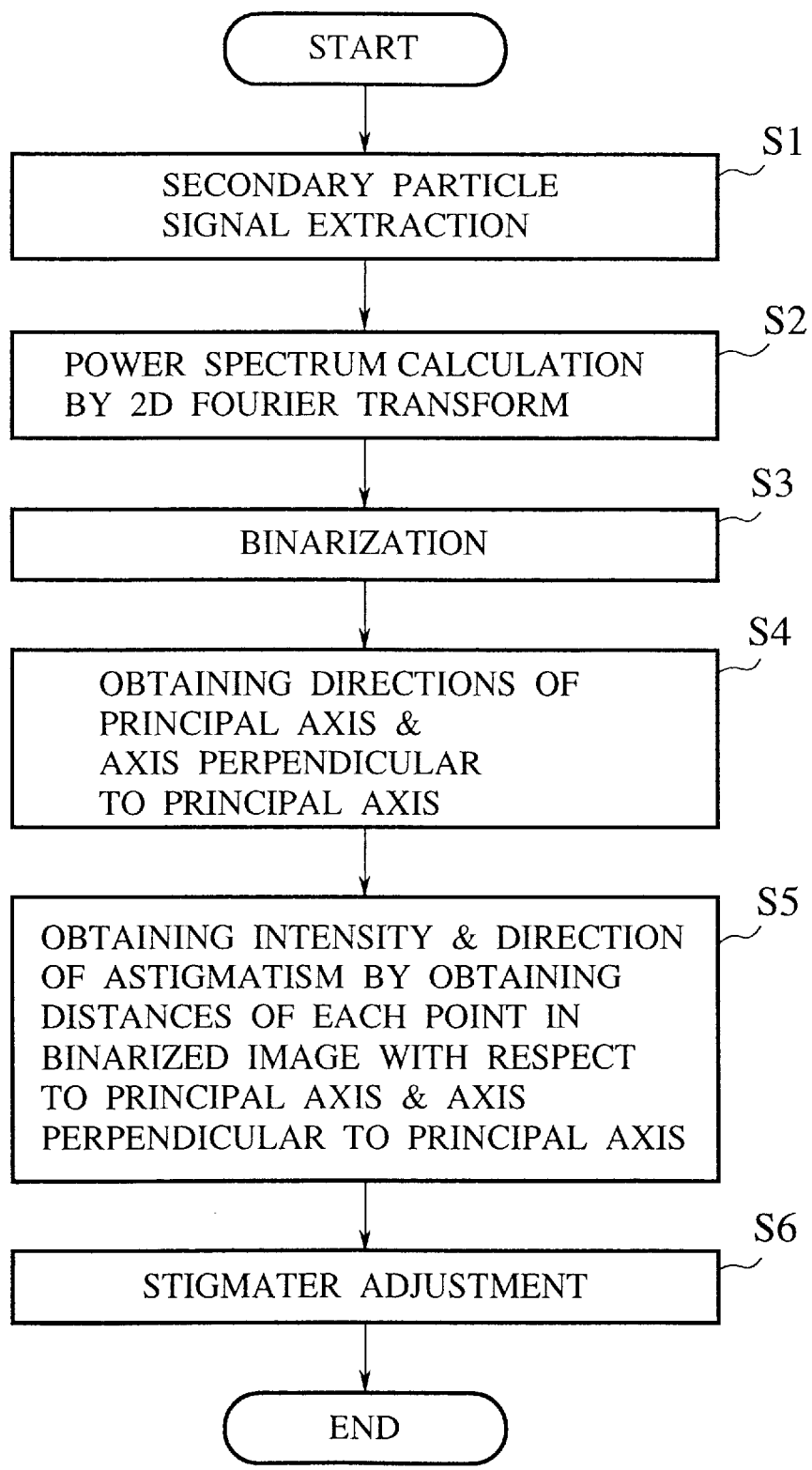
FIG. 24 is a flow chart for an astigmatism correction processing according to the fifth embodiment of the present invention.
Figure 25:
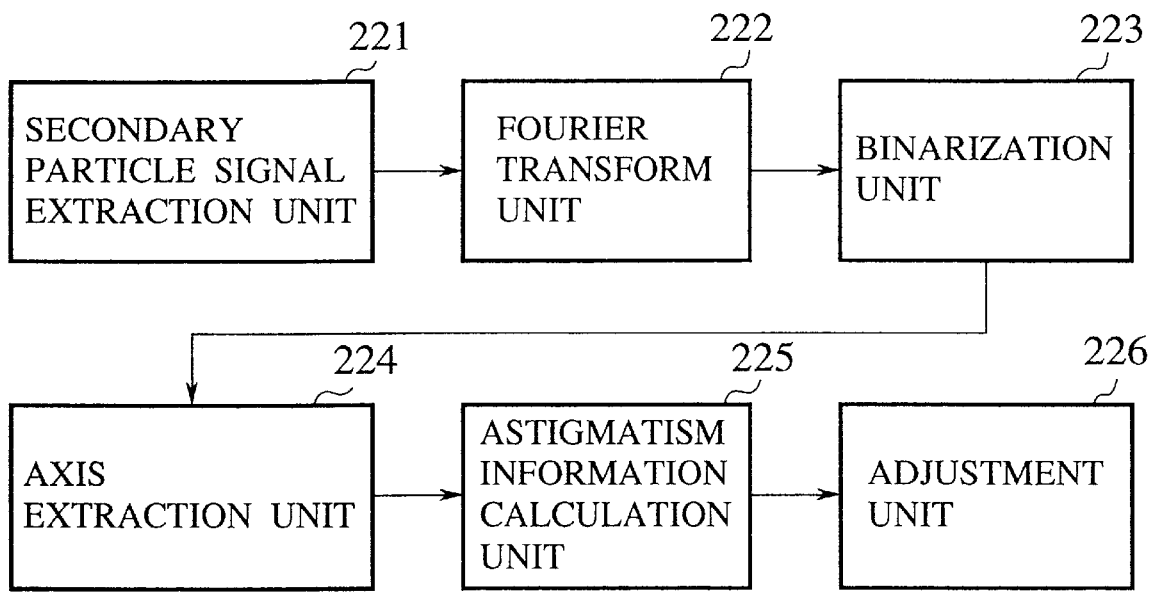
FIG. 25 is a schematic block diagram of an astigmatism correction apparatus according to the fifth embodiment of the present invention.

FIG. 24 shows the flow chart for an astigmatism correction processing in this fifth embodiment which will be described in detail below, while FIG. 25 shows a configuration of an astigmatism correction apparatus in this fifth embodiment, which is to be used in conjunction with the SEM as shown in FIG. 1 described above.

The astigmatism correction apparatus of FIG. 25 comprises: a secondary particle signal extraction unit 221 for entering the detection signals of the detector 11 in a charged particle beam optical system of the SEM of FIG. 1 and extracting secondary particle signals due to the two-dimensional scan of the electron beam; a Fourier transform unit 222 for calculating a power spectrum by carrying out the Fourier transform in the two-dimensional space of the secondary particle signals; a binarization unit 223 for obtaining a binarized image by binarizing the power spectrum; an axis extraction unit 224 for obtaining an axis in a direction perpendicular to the principal axis of each point in the binarized image; an astigmatism information calculation unit 225 for determining an intensity and a direction of the astigmatism by obtaining distances of each point in the binarized image with respect to the principal axis and the axis in a direction perpendicular to the principal axis; and an adjustment unit 226 for adjusting the driving of the stigmater 15 in the charged particle beam optical system according to the intensity and the direction of the astigmatism.

Figure 26:
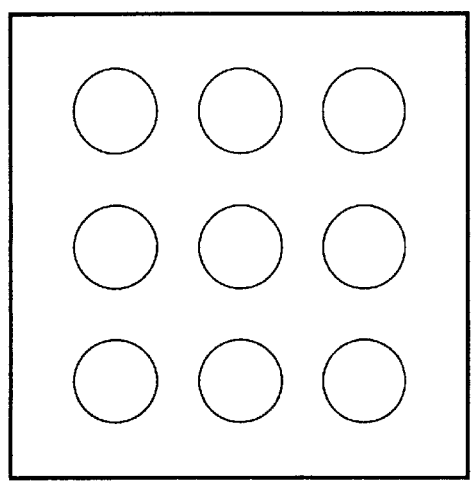
FIG. 26 is a diagram illustrating an exemplary standard sample used in the fifth embodiment of the present invention.

Here, as a standard sample to be used in the adjustment of the astigmatism, a sample having circular patterns thereon as shown in FIG. 26 is provided in advance. These circular patterns can be provided in forms of contact holes or gold particles in the semiconductor, so that a sample having such circular patterns is set in the SEM at a time of the astigmatism correction. Then, the astigmatism correction processing according to the flow chart of FIG. 24 is carried out as follows.

First, the optimal focus position of the SEM image obtained by imaging the sample is obtained by using the auto-focusing function. This auto-focusing function is realized by a scheme in which a focal point position at which the contrast in the X-direction becomes maximum and a focal point position at which the contrast in the Y-direction becomes maximum in the SEM image are obtained, and an average position of these focal point positions are used as the optimal focus position.

Next, the SEM image I for which the focal point position is slightly displaced from the optimal focus position is entered. Namely, the electron beam is two-dimensionally scanned over the sample and the resulting secondary particle signals are extracted by the secondary particle signal extraction unit 221 (step S1).

Next, the image I is Fourier transformed by the Fourier transform unit 222 so as to calculate a power spectrum image If (step S2). This power spectrum image If is produced so that low frequency components (DC components) appear at an image center.

Figure 27:
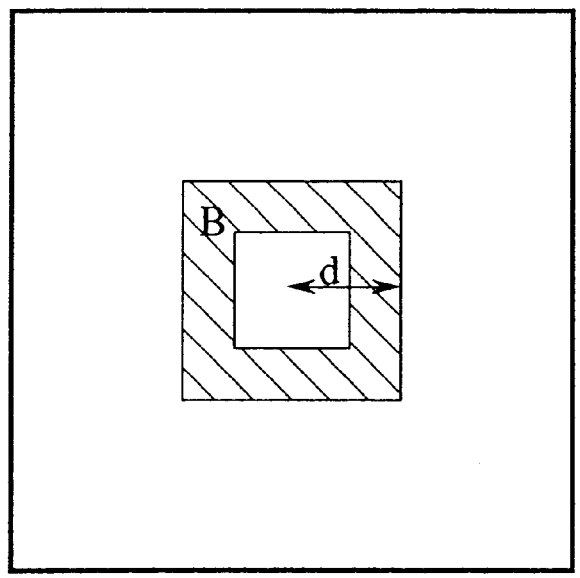
FIG. 27 is a diagram illustrating a rectangular band region used in a binarization step in the flow chart of FIG. 24.

Then, a band B of a rectangular overall shape is set up at positions distanced by a certain distance d from the center of the image If as shown in FIG. 27, and the average luminance A and the standard deviation $\sigma$ of the interior of the band B are obtained. This band B may be in a circular ring shape instead of the rectangular shape. A value of the distance d and a width of the band B can be set up empirically. Since the sample used for the adjustment is always the same, these values can be set up once and then fixedly used thereafter.

Figure 28:
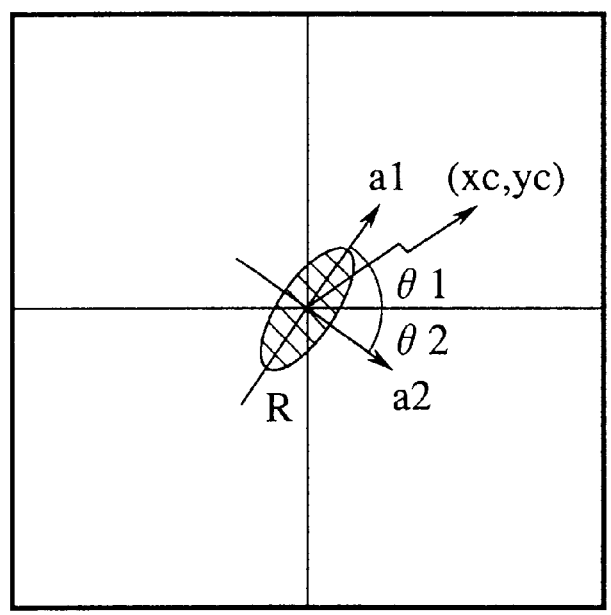
FIG. 28 is a diagram illustrating an elongated elliptic region that can be obtained by a binarization step in the flow chart of FIG. 24 under the presence of astigmatism.
Figure 29:
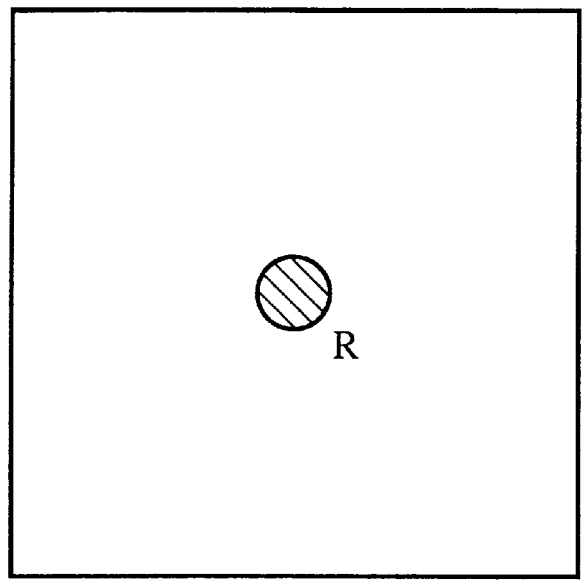
FIG. 29 is a diagram illustrating a circular region that can be obtained by a binarization step in the flow chart of FIG. 24 under the absence of astigmatism.

Next, the power spectrum image If is binarized at $A+2\sigma$ by the binarization unit 223 (step S3). The image If of the contact holes has prominently large low frequency components near the center so that it is possible to extract only the central portion of the image If by this binarization. Then, the labeling and the histogram processing are applied to an image Ib obtained by the binarization, so as to remove tiny area portions as noises. When the astigmatism exists, the SEM image I is blurred toward a certain direction, so that more low frequency components appear toward a direction of the blurring. For this reason, as shown in FIG. 28, a region R in the image If takes an elongated elliptic shape with a direction of the blurring as a minor axis. In contrast, when there is no astigmatism, as shown in FIG. 29, the region R in the image If takes a nearly circular shape, so that a ratio of a length in the major axis direction and a length in the minor axis direction can be used as a scale for indicating the intensity of the directionality of the blurring.

In practice, the region R is not a true ellipse and its contour has irregularities so that it is not easy to obtain the major axis length and the minor axis length by detecting the ellipse from the image Ib. For this reason, the principal axis a1 and the axis a2 perpendicular to the principal axis of the region R are obtained by calculating the central moment of second order M from the following equations (24) and (25) (step S4).

$$\tan^2\theta + [\{M(2, 0) - M(0, 2)\} / M(1, 1)]\tan\theta - 1 = 0 \quad (24)$$

$$M(p, q) = \sum_{i,j} (i - xc)^p (1 - yc)^q f_{ij} \quad (25)$$

where (i, j) is a coordinate on the image Ib, (xc, yc) is a coordinate of a center of gravity of the region R in the image Ib, and fij is such a function that fij=0 when a value of the point (i, j) in the image Ib is 0 and fij=1 when a value of the point (i, j) in the image Ib is not 0. Two solutions θ1 and θ2 obtained by solving the above equation (24) indicate the principal axis direction and the direction of the axis perpendicular to the principal axis.

Next, in order to judge which one of the axis a1 in the direction θ1 and the axis a2 in the direction θ2 is the principal axis, the distances of each point contained in the region R with respect to a1 and a2 are obtained and their averages D1 and D2 are obtained by the astigmatism information calculation unit 225. Then, if D2>D1, a1 is determined as the principal axis and h=D1/D2 is calculated, so as to obtain the intensity and the direction of the astigmatism. On the other hand, if D1>D2, a2 is determined as the principal axis and h=D2/D1 is calculated, so as to obtain the intensity and the direction of the astigmatism (step S5).

Note that h approaches to 0 when the region R has an elongated shape while h approaches to 1 when the region R is almost circular. Consequently, h becomes an index which indicates the intensity of the directionality of the blurring, and the adjustment unit 226 continually adjusts the driving voltage or the driving current of the stigmater such that h approaches to 1 (step S6).

The direction of the blurring is in a direction perpendicular to the principal axis, so that it is also possible to realize the quick astigmatism correction by preparing an adjustment table registering the optimum stigmater adjustment value according to the blurring direction and the blurring intensity h, and adjusting the stigmater by referring to this table.

In this manner, according to this fifth embodiment, it is possible to obtain the direction and the intensity of the astigmatism at high precision, by binarizing the power spectrum which is the Fourier transform of the secondary particle signals obtained at a time of the two-dimensional scanning of the sample by the electron beam, and obtaining the distances of each point in the obtained binarized image with respect to the principal axis and the axis in a direction perpendicular to the principal axis. In this case, the adjustment of the stigmater is not relying on the visual sense of the operator so that no difference in the adjustment accuracy or the adjustment time will be caused depending on the skills of the operator. Consequently, it becomes possible to carry out the astigmatism correction at high precision easily in the SEM for the purpose of observing the sample surface, and it becomes possible to prevent the lowering of the observation precision according to the cross sectional shape of the electron beam that can be caused by the astigmatism.

Note that the sample having circular patterns thereon is used as the standard sample in this fifth embodiment, but the sample is not necessarily limited to this type, and any sample in which the principal axis can be identified by applying the Fourier transform and the binarization to extract the low frequency components can be used as the standard sample. Also, in the above description, the intensity of the astigmatism is obtained as a ratio of the average distance D1 with respect to the principal axis and the average distance D2 with respect to the axis perpendicular to the principal axis of each point in the binarized image, but it is also possible to obtain the intensity of the astigmatism as a ratio of a sum S1 of the distances with respect to the principal axis and a sum S2 of the distances with respect to the axis perpendicular to the principal axis of all the points in the binarized image.

Note also that this fifth embodiment is not only applicable to an observation device such as SEM, but also applicable to a charged particle beam drawing device for drawing LSI patterns by using the electron beam or ion beam.

Referring now to FIG. 30 to FIG. 38, the sixth embodiment of the present invention will be described in detail. This sixth embodiment is also directed to a method and an apparatus for realizing the astigmatism correction in a charged particle beam optical system of an electron optics device such as scanning electron microscope.

Figure 30:
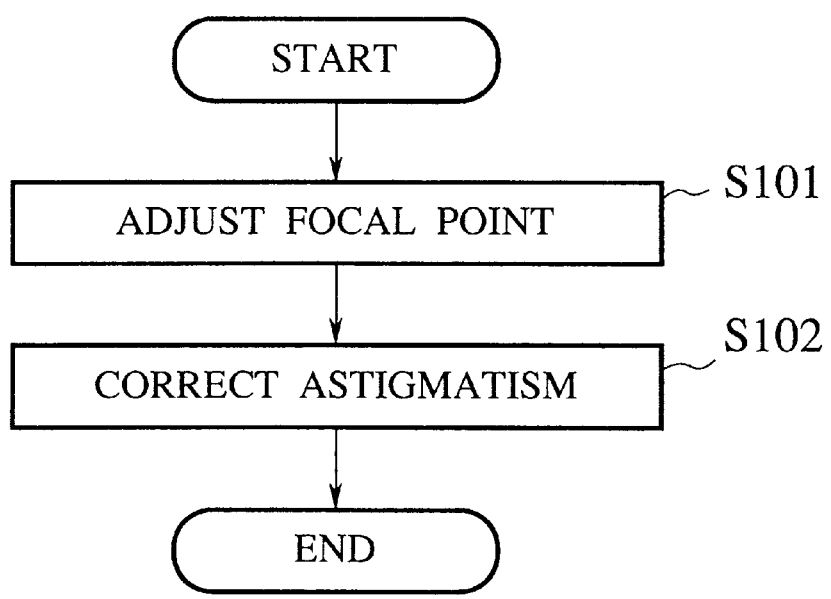
FIG. 30 is a flow chart for an astigmatism correction processing according to the sixth embodiment of the present invention.

FIG. 30 shows the flow chart for an astigmatism correction processing in this sixth embodiment. Here, the charged particle beam optical system constitutes the SEM as shown in FIG. 1 described above. In this astigmatism correction processing of FIG. 30, the secondary particle signal image (SEM image) is imaged by the SEM first, the optimal focus position is detected from the SEM image, and the focal point is adjusted to the optimal focus position (step S101). Then, the stigmater is adjusted in a state where the focal point is adjusted to the optimal focus position, so as to correct the astigmatism (step S102).

Figure 31:
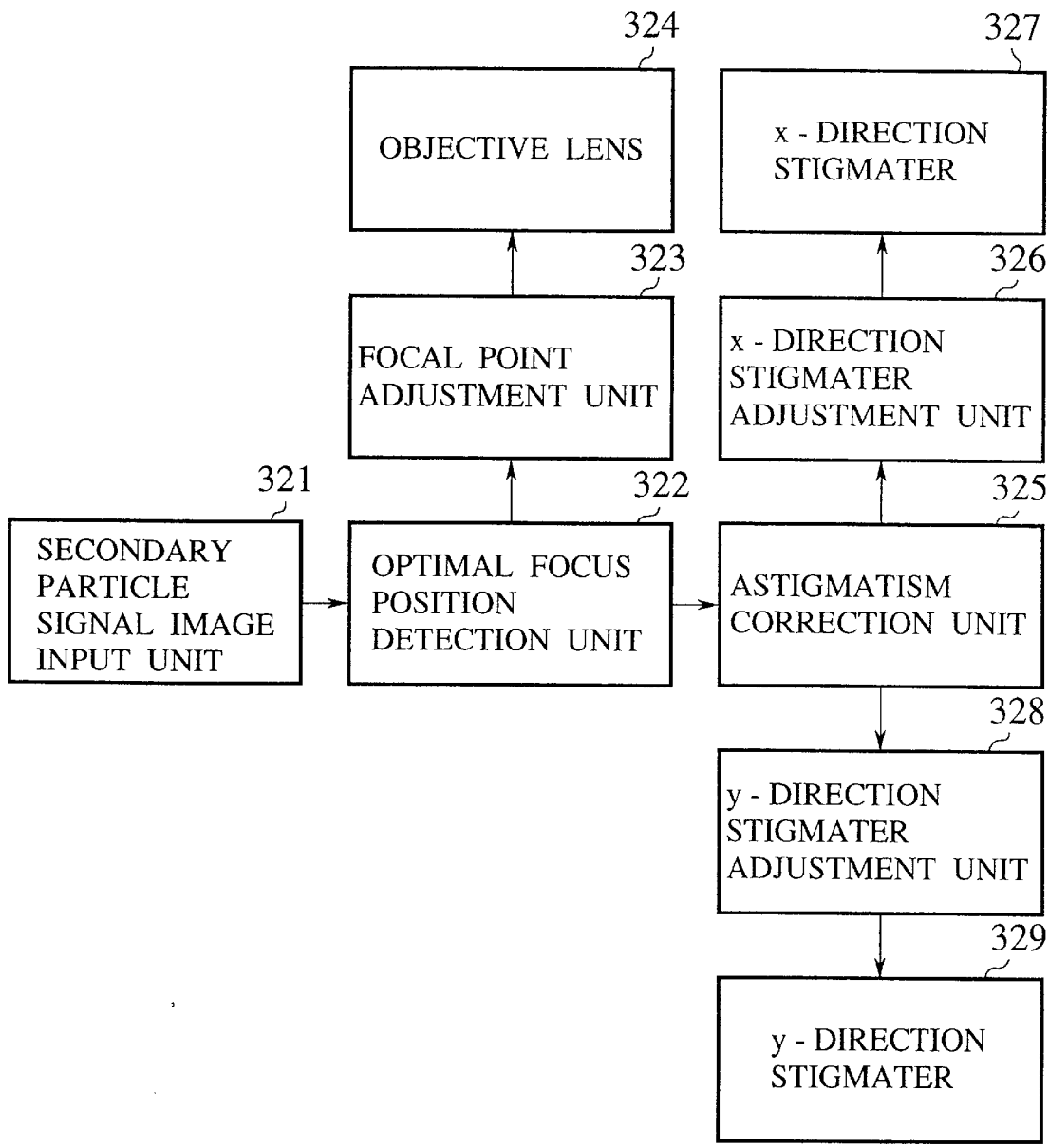
FIG. 31 is a schematic block diagram of an astigmatism correction apparatus according to the sixth embodiment of the present invention.

FIG. 31 shows a configuration of an astigmatism correction apparatus in this sixth embodiment, which is to be used in conjunction with the SEM as shown in FIG. 1 described above.

The astigmatism correction apparatus of FIG. 31 comprises: a secondary particle signal image input unit 321 for entering the detection signals of the detector 11 in a charged particle beam optical system of the SEM of FIG. 1 and extracting secondary particle signals due to the two-dimensional scan of the electron beam; an optimal focus position detection unit 322 for obtaining the optimal focus position by using the entered secondary particle signal image; a focal point adjustment unit 323 for controlling an objective lens 324 of the SEM for changing the focal point position; an astigmatism correction unit 325 for correcting the astigmatism after the focal point is adjusted; an x-direction stigmater adjustment unit 326 for adjusting the driving of an x-direction stigmater 327 of the SEM under the control of the astigmatism correction unit 325; and a y-direction stigmater adjustment unit 328 for adjusting the driving of a y-direction stigmater 329 of the SEM under the control of the astigmatism correction unit 325.

Note that the objective lens 324 corresponds to the objective lens 6 of FIG. 1, while the x-direction stigmater 327 and the y-direction stigmater 329 constitute the stigmater 15 of FIG. 1.

Here, as a standard sample to be used in the adjustment of the astigmatism, a sample having circular patterns thereon as shown in FIG. 26 is provided in advance. These circular patterns can be provided in forms of contact holes or gold particles in the semiconductor, so that a sample having such circular patterns is set in the SEM at a time of the astigmatism correction. Then, the astigmatism correction processing according to the flow chart of FIG. 30 is carried out.

Figure 32:
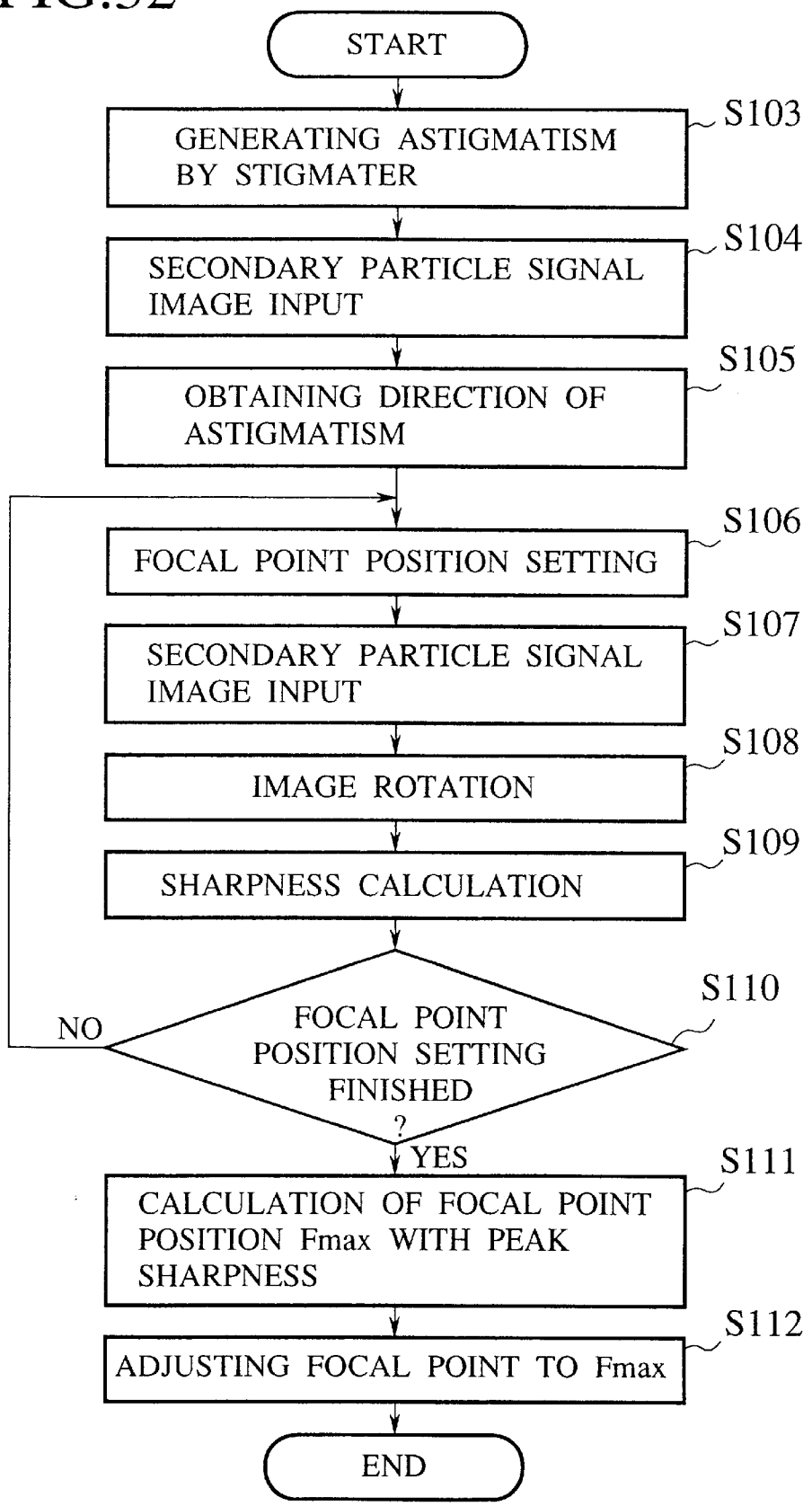
FIG. 32 is a flow chart for a detailed processing of a focal point adjusting step in the flow chart of FIG. 30.

At the step S101, the processing for detecting the optimal focus position by using the SEM image and adjusting the focal point is carried out according to the flow chart of FIG. 32 as follows.

First, the x-direction stigmater 327 and the y-direction stigmater 329 are largely displaced from their normal positions so as to cause a large astigmatism intentionally (step S103). Here, the large astigmatism can be caused easily by setting the x-direction stigmater 327 and the y-direction stigmater 329 to prescribed numerical value settings.

Then, the secondary particle signal image I for which the focal point position is slightly displaced from the optimal focus position is entered (step S104), and the direction of the astigmatism is obtained according to the entered secondary particle signal image I (step S105).

Figure 33:
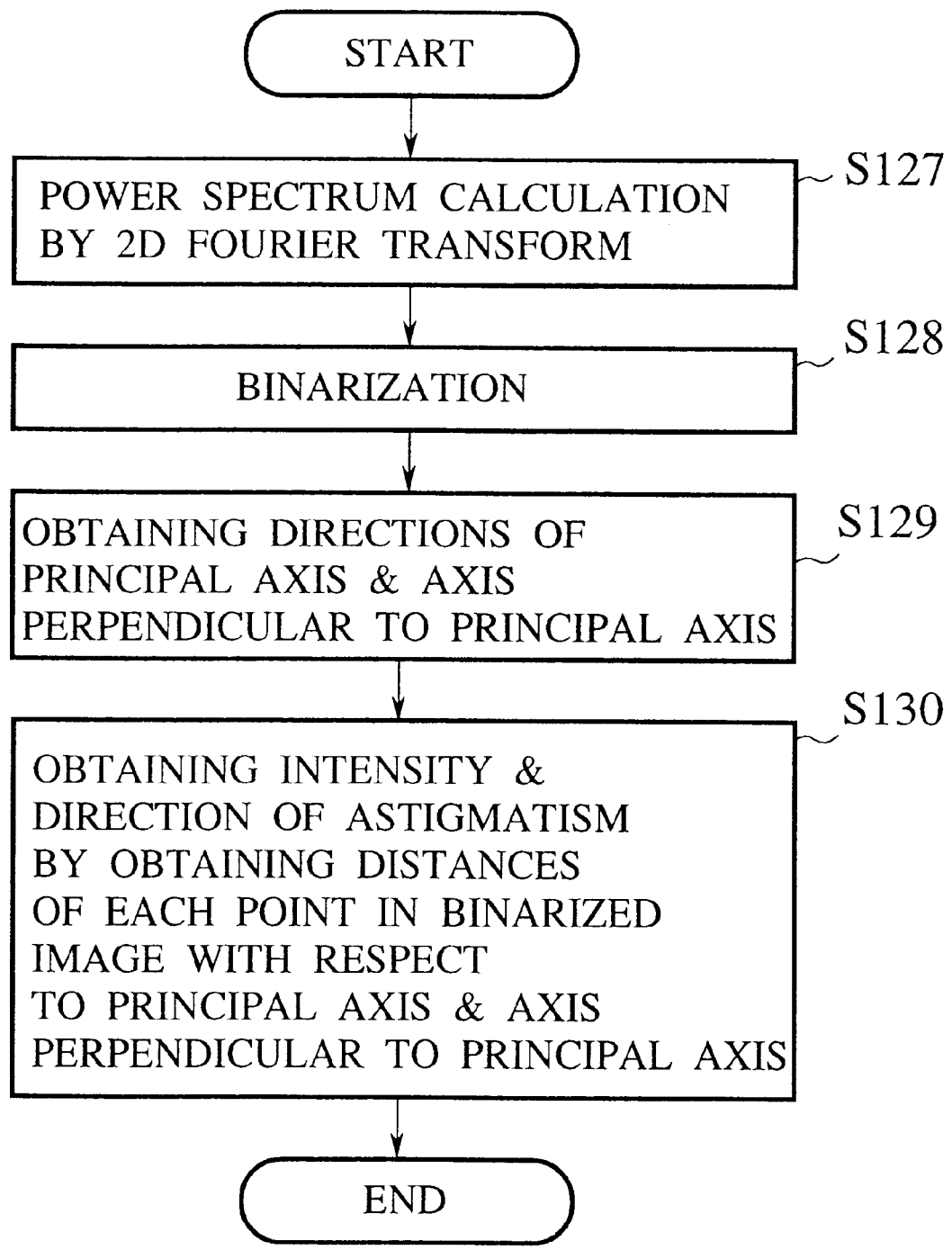
FIG. 33 is a flow chart for a detailed processing of a direction of astigmatism obtaining step in the flow chart of FIG. 32.
Figure 34:
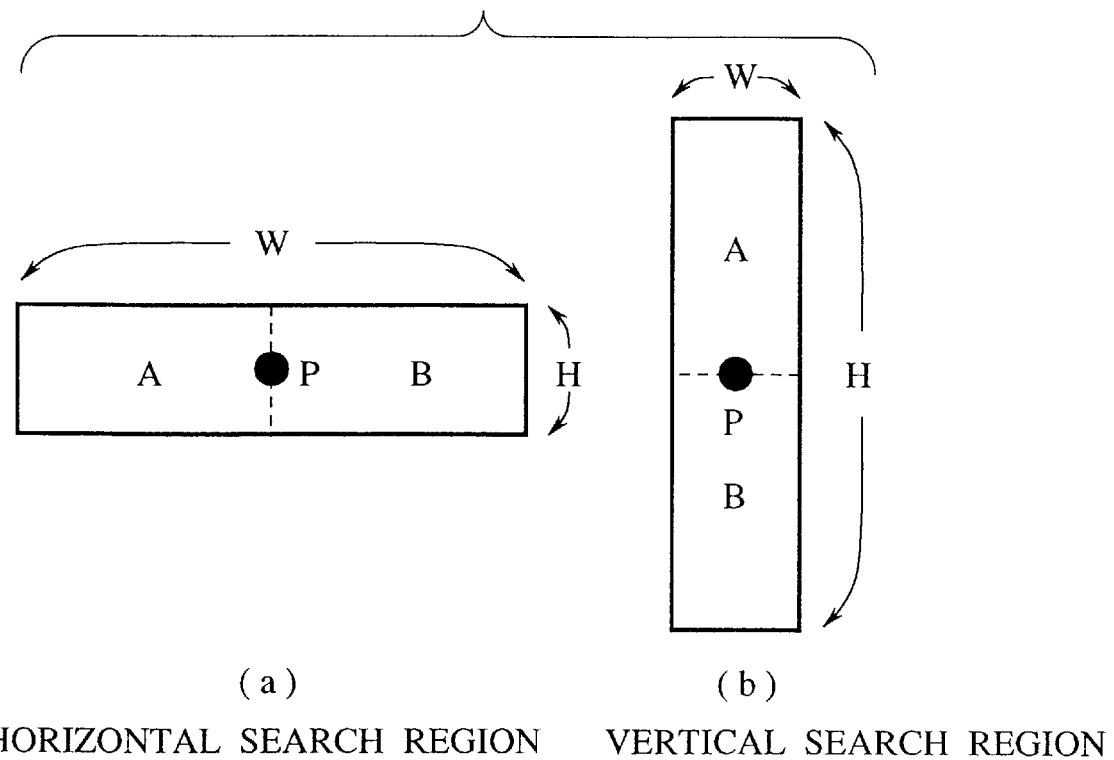
FIG. 34 is a diagram illustrating search regions used in a sharpness calculation step in the flow chart of FIG. 32.

Here, the processing for obtaining the direction of the astigmatism at the step S105 is realized according to the flow chart of FIG. 33 as follows.

First, the secondary particle signal image I for which the focal point position is slightly displaced from the optimal focus position is Fourier transformed, so as to calculate a power spectrum image If (step S127). This power spectrum image If is produced so that low frequency components (DC components) appear at an image center.

Then, a band B of a rectangular overall shape as shown in FIG. 27 is set up at positions distanced by a certain distance d from the center of the image If as shown in FIG. 27, and the average luminance A and the standard deviation σ of the interior of the band B are obtained. This band B may be in a circular ring shape instead of the rectangular shape. A value of the distance d and a width of the band B can be set up empirically. Since the sample used for the adjustment is always the same, these values can be set up once and then fixedly used thereafter.

Next, the power spectrum image If is binarized at A+2σ (step S128). The image If of the contact holes has prominently large low frequency components near the center so that it is possible to extract only the central portion of the image If by this binarization. Then, the labeling and the histogram processing are applied to an image Ib obtained by the binarization, so as to remove tiny area portions as noises. When the astigmatism exists, the SEM image I is blurred toward a certain direction, so that more low frequency components appear toward a direction of the blurring. For this reason, as shown in FIG. 28, a region R in the image If takes an elongated elliptic shape with a direction of the blurring as a minor axis.

In practice, however, the region R is not a true ellipse and its contour has irregularities so that it is not easy to obtain the major axis length and the minor axis length by detecting the ellipse from the image Ib. For this reason, the principal axis a1 and the axis a2 perpendicular to the principal axis of the region R are obtained by calculating the central moment of second order M from the following equations (24) and (25) (step S129).

$$\tan^2\theta + [\{M(2, 0) - M(0, 2)\} / M(1, 1)]\tan\theta - 1 = 0 \quad (24)$$

$$M(p, q) = \sum_{i,j} (i - xc)^p (1 - yc)^q fij \quad (25)$$

where (i, j) is a coordinate on the image Ib, (xc, yc) is a coordinate of a center of gravity of the region R in the image Ib, and fij is such a function that fij=0 when a value of the point (i, j) in the image Ib is 0 and fij=1 when a value of the point (i, j) in the image Ib is not 0.

Two solutions θ1 and θ2 obtained by solving the above equation (24) indicate the principal axis direction and the direction of the axis perpendicular to the principal axis. In order to judge which one of the axis a1 in the direction θ1 and the axis a2 in the direction θ2 is the principal axis, the distances of each point contained in the region R with respect to a1 and a2 are obtained and their averages D1 and D2 are obtained. Then, if D2>D1, a1 is determined as the principal axis. Since the direction of the blurring is in a direction perpendicular to the principal axis, a direction perpendicular to the principal axis is determined as the direction of the astigmatism (step S130).

Note that, in the procedure for obtaining the direction of the astigmatism described above, instead of calculating the central moment of second order, it is also possible to obtain distances from the image center of the image Ib to points on the elliptic contour portion around the image center, and determine the direction of the astigmatism as a direction perpendicular to a direction for which the obtained distance is maximum. It is also possible to determine the direction of the astigmatism as an average direction between a direction perpendicular to a direction for which the obtained distance is maximum and a direction for which the obtained distance is minimum. It is also possible to determine the direction of the astigmatism as a direction for which the obtained distance is minimum.

Now, after the step S105 for obtaining the direction of the astigmatism is completed, the secondary particle signal images are entered while changing the focal point position and the optimal focus position is determined. Here, a range for changing the focal point position is set up in advance, and the focal point position is displaced at constant steps within this prescribed range (step S106), and then the secondary particle signal image is entered at each focal point position set up by the step S106 (step S107).

Then, with respect to the entered secondary particle signal image, the affine transformation with the image center as a center of rotation is applied, so as to obtain an image $I_R$ in which the image is rotated as much as the direction $\theta_S$ of the astigmatism (step S108). Here, for the point (x, y) in the entered image, the position (x', y') after the rotation can be obtained by applying the following transformation equations (26) and (27).

$$x' = x \cos(\theta_S) - y \sin(\theta_S) \quad (26)$$

$$y' = x \sin(\theta_S) + y \cos(\theta_S) \quad (27)$$

Then, for this rotated image $I_R$, the sharpness is calculated (step S109).

Figure 2:
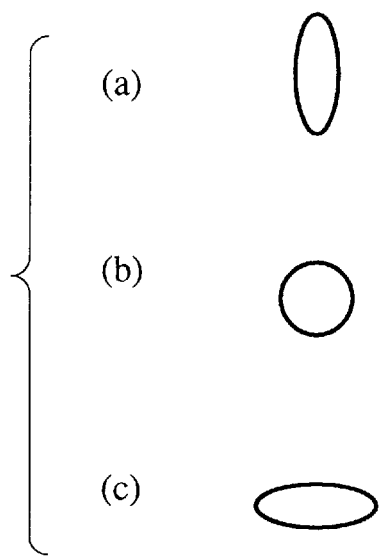
FIG. 2 is a diagram illustrating three exemplary states of a beam cross section shape in a conventional scanning electron microscope under the presence of astigmatism.
Figure 3:
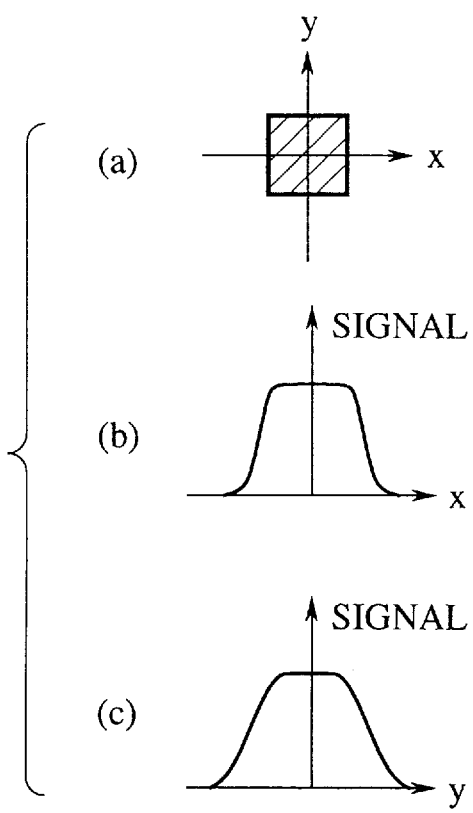
FIG. 3 is a diagram illustrating exemplary forms of a sample and image signals in two directions in a conventional scanning electron microscope under the presence of astigmatism.
Figure 4:
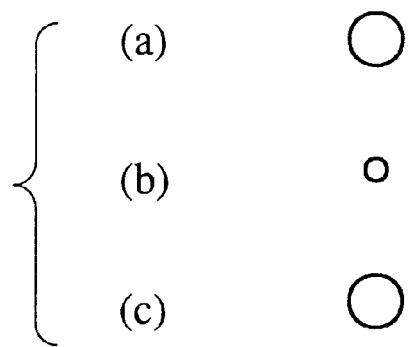
FIG. 4 is a diagram illustrating three exemplary states of a beam cross section shape in a conventional scanning electron microscope after the astigmatism correction.
Figure 5:
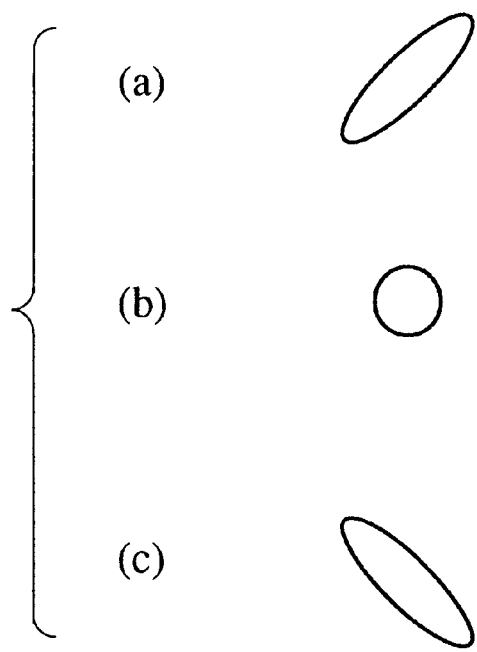
FIG. 5 is a diagram illustrating another three exemplary states of a beam cross section shape in a conventional scanning electron microscope under the presence of astigmatism.

When the astigmatism exists, the beam shape is changed by 90 degrees as the focal point position is changed from one side of the optimal focus position to another side, as shown in parts (a) and (c) of FIG. 2 or FIG. 5 described above, so that the direction of the blurring (the direction of the astigmatism) is also changed by 90 degrees as the focal point position is changed from one side of the optimal focus position to another side. In other words, in the rotated image $I_R$, the direction of the blurring is changed from the x-direction to the y-direction or from the y-direction to the x-direction as the focal point position is changed from one side of the optimal focus position to another side, so that the sharpness of the image can be calculated from levels of blurring in the x-direction and the y-direction.

Then, the focal point position setting step S106 to the sharpness calculation step S109 are repeated within a prescribed range of the focal point position (step S110).

The image with the adjusted focal point has more high frequency components within image than the image with the displaced focal point. For this reason, the focal point position at which the high frequency components become maximum is usually calculated by obtaining a power spectrum of frequencies using the Fourier transform or by applying a high range sharpening filter such as a differentiation filter. However, the SEM image contains many high frequency components due to noises, so that it is difficult to analyze a change of the high frequency components on the sample in detail by using the Fourier transform or a usual differentiation filter in a case of the SEM image.

For this reason, this sixth embodiment employs a scheme by which the optimal focus position can be determined stably even with respect to the noisy image, in which a filter capable of sharpening an edge portion on the sample without being affected by the random noise is applied to the SEM image and a total sum of the luminances in the obtained edge sharpened image is used as a scale of the sharpness. This scheme will now be described in detail with reference to FIG. 34.

First, search regions (of a height H and a width W each) in the vertical direction and the horizontal direction with each point P in the image as a center of gravity are set up. Then, each search region is divided into two regions A and B at a line passing through the point P. Then, the variance value between these regions A and B is calculated for each of the horizontal search region (a part (a) of FIG. 34) and the vertical search region (a part (b) of FIG. 34) according to the following equation (28).

$$\sigma = (m_A - m_T) \times (m_A - m_T) + (m_B - m_T) \times (m_B - m_T) \qquad (28)$$

where $m_A$ and $m_B$ are average luminances of pixels contained in the regions A and B respectively, while $m_T$ is an average luminance of the entire search region combining the regions A and B.

The variance value between regions takes a large value when there exists a step shaped edge between the region A and the region B, but takes a small value in a region which only contains the random noise provided that the height and width of the search region are sufficiently large. For this reason, it is possible to sharpen only the true edge portion that exists on the sample even in a case of the image with many noises. At each point P in the image, the horizontal search region variance value σh and the vertical search region variance value σv are obtained, and the variance value σ of the point P is determined as σv when σh<σv, or as σh when σh>σv.

The horizontal search region variance value σh has a large value when there exists a vertical edge in a vicinity of the point P. In contrast, the vertical search region variance value σv has a large value when there exists a horizontal edge in a vicinity of the point P. When the focal point position is displaced, the rotated image $I_R$ becomes blurred in the horizontal direction (x-direction) or the vertical direction (y-direction) so that either the vertical edge or the horizontal edge is in a blurred state and either σh or σv at the point P gas a value lower than a case of using the optimal focus position. For this reason, the sum S of of the variance values over the entire image takes the highest value for the image entered at the optimal focus position. Consequently, the sum S of the variance values at all points in the image will be used as the sharpness against which the level of blurring of the image is to be assessed.

Figure 35:
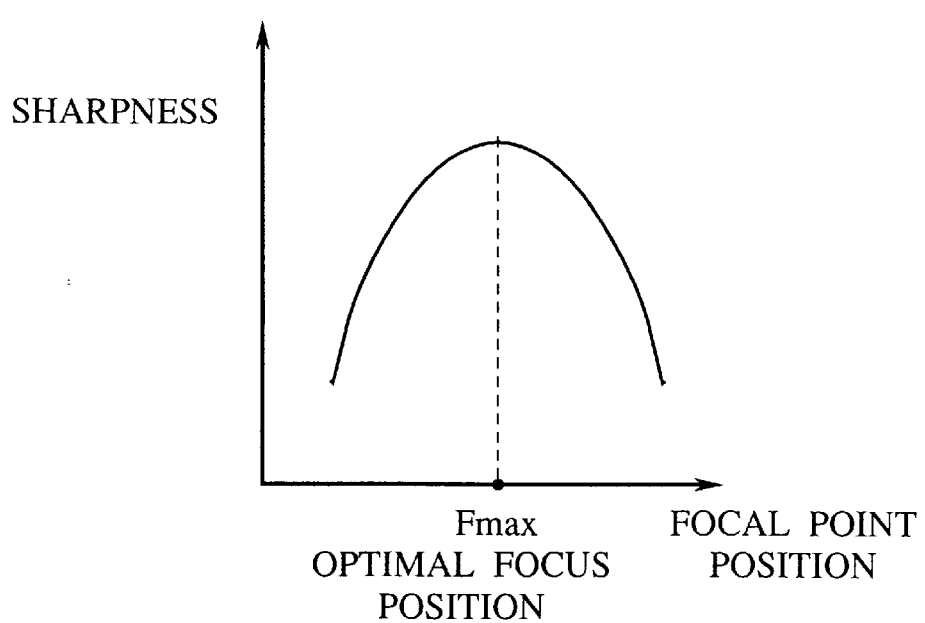
FIG. 35 is a diagram illustrating a sharpness curve used in a focal point position with a peak sharpness calculating step in the flow chart of FIG. 32.

Here, the secondary particle signal image is sequentially entered while sequentially displacing the focal point position from a prescribed start point to a prescribed end point at constant interval. Then, the sharpness Si at each focal point position Fi is obtained. Then, a sharpness curve as shown in FIG. 35 is produced by plotting the obtained sharpness Si along the vertical axis and the focal point position Fi along the horizontal axis. This sharpness curve has an upward convex shape with the optimal focus position at a peak, so that it is possible to detect the optimal focus position by obtaining the focal point position Fmax corresponding to a peak sharpness (step S111). Then, the objective lens 324 is adjusted and the focal point position is adjusted to Fmax (step S112).

As a method for calculating the peak position, apart from a method for simply obtaining the focal point position at which the sharpness becomes maximum as described above, it is also possible to use a method for fitting a curve such as the Gaussian distribution curve or the quadratic curve to the sharpness curve and obtaining a peak position on this fitted curve. Also, points to be used in obtaining the sharpness are not necessarily all points in the image and may be points within a limited region. In addition, the sharpness may be obtaining as a sum of the variance values σ of the points normalized by the maximum value σmax of the variance values of the points, e.g., a sum of the variance values of the points which are converted into 8 bit image values by the formula: (σ/σmax)×255. It is also possible to use the variance values between regions on a single line by setting the height of the horizontal search region as H=1 and the width of the vertical search region as W=1.

Note here that, at the sharpness calculation step S109 described above, the sum S of the variance values at the points in the image is used as the sharpness against which the level of blurring of the image is to be assessed, but it is also possible to use an average value of the variance values at the points in the image as the sharpness. In addition, the maximum value of the variance values between regions defined in each search region is used as the variance value at each point in the image, but it is also possible to use an average value of the variance values between region as the variance value at each point in the image.

Figure 36:
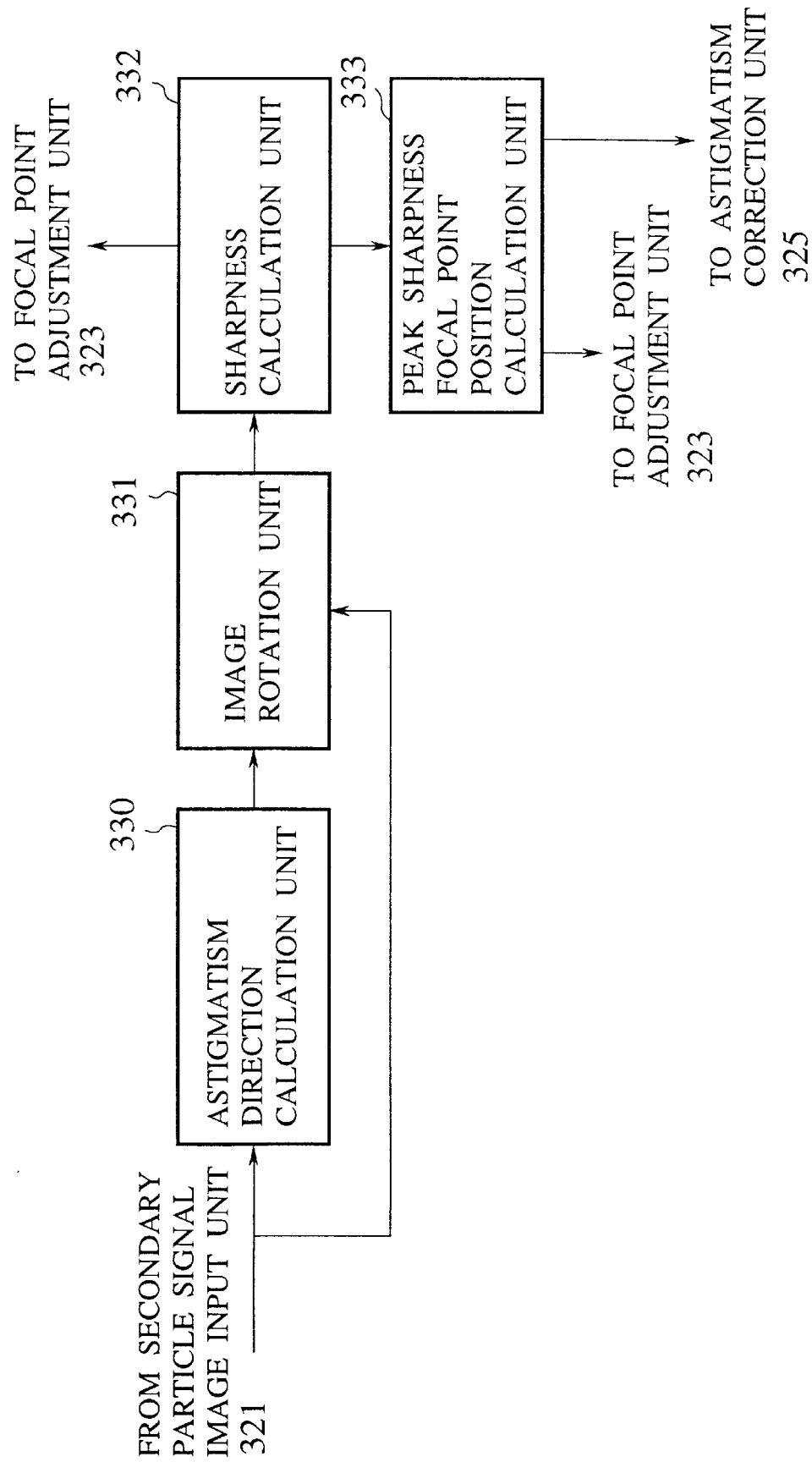
FIG. 36 is a block diagram of an internal configuration of an optimal focus position detection unit in the apparatus of FIG. 31.

FIG. 36 shows an internal configuration of the optimal focus position detection unit 322 in the astigmatism correction apparatus of FIG. 31.

In this configuration of FIG. 36, the optimal focus position detection unit comprises: an astigmatism direction calculation unit 330 for calculating a direction of the astigmatism from the image obtained by the secondary particle signal image input unit 321 to which the detection signals of the detector 11 in a charged particle beam optical system of the SEM of FIG. 1 are entered and from which the secondary particle signals due to the two-dimensional scan of the electron beam are outputted; an image rotation unit 331 for rotating the image entered from the secondary particle signal image input unit 321 as much as the direction of the astigmatism obtained by the astigmatism direction calculation unit 330 and setting the direction of the astigmatism as the horizontal direction (x-direction) of the image; a sharpness calculation unit 332 for calculating the sharpness for the rotated image by using the method described above; and a peak sharpness focal point position calculation unit 333 for calculating a focal point position with a peak sharpness from the sharpness curve produced by using the sharpnesses calculated at a plurality of focal point positions, and outputting the calculated focal point position with the peak sharpness to the focal point adjustment unit 323 and the astigmatism correction unit 325. Here, the sharpness calculation unit 332 sequentially outputs a prescribed focal point position to the focal point adjustment unit 323 so that the focal point position is sequentially displaced from a prescribed start point to a prescribed end point at constant interval.

Figure 37:
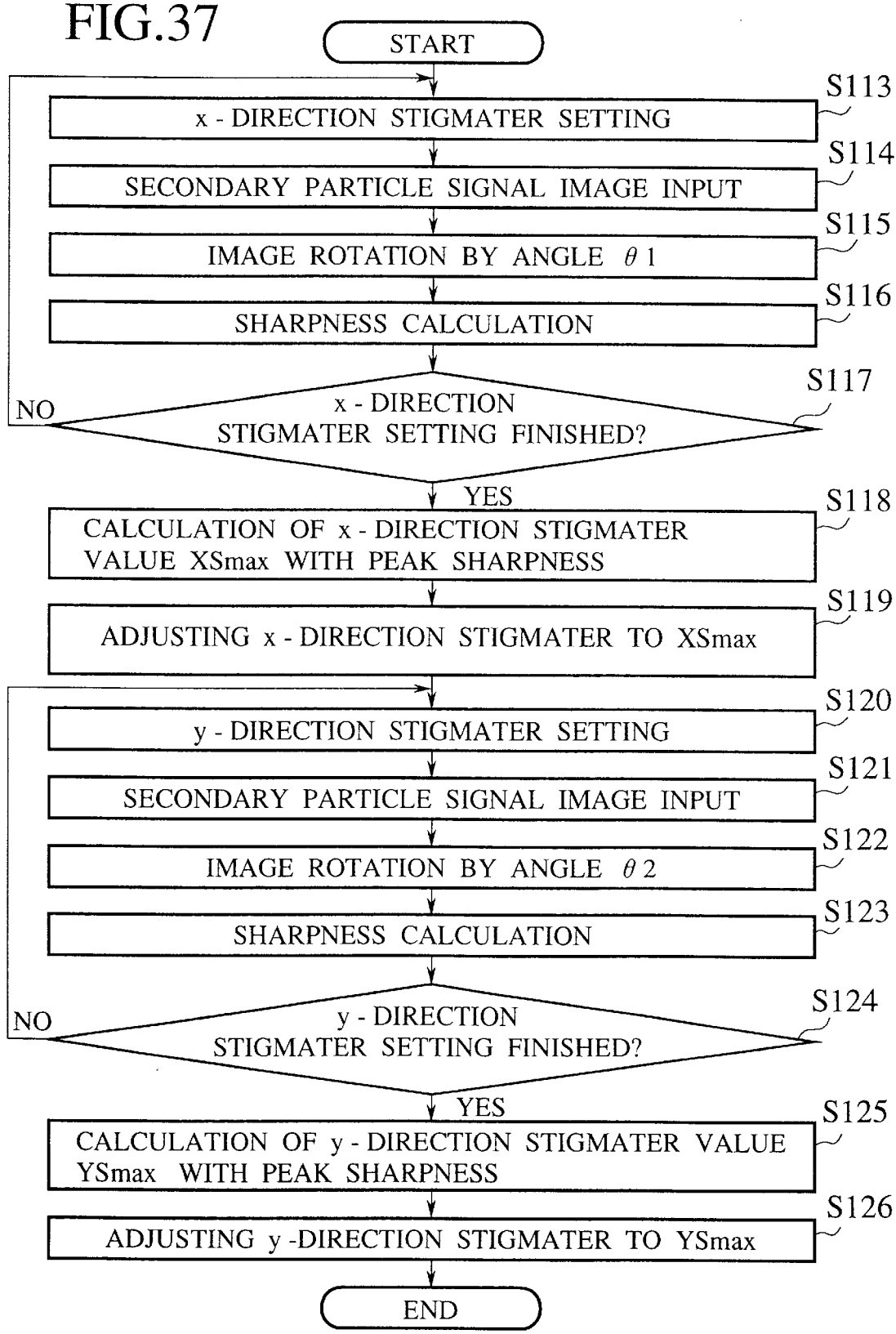
FIG. 37 is a flow chart for a detailed processing of an astigmatism correcting step in the flow chart of FIG. 30.

Next, the processing for correcting the astigmatism by entering the image of the adjusted focal point at the step S102 is carried out according to the flow chart o FIG. 37 as follows.

First, the x-direction stigmater 327 is changed from a prescribed position at a prescribed step (step S113), and the secondary particle signal image is entered (step S114). Then, the entered secondary particle signal image is rotated for a prescribed angle θ1 (step S115). Normally, this θ1 is set equal to 45°. A method for rotating the image can be the same as that used in the optimal focus position detection processing. Then, the sharpness of the rotated image is obtained by the same method as used in the optimal focus position detection processing (step S116). Then, the x-direction stigmater setting step S113 to the sharpness calculation step S116 are repeated within a prescribed range (step S117).

Next, the x-direction stigmater value XSmax with a peak sharpness is obtained by the same method as used in the optimal focus position detection processing (step S118). Then, the x-direction stigmater 327 is adjusted to XSmax (step S119).

Next, the y-direction stigmater 329 is changed from a prescribed position at a prescribed step (step S120), and the secondary particle signal image is entered (step S121). Then, the entered secondary particle signal image is rotated for a prescribed angle θ2 (step S122). Normally, this θ1 is set equal to 0°. A method for rotating the image can be the same as that used in the optimal focus position detection processing. Then, the sharpness of the rotated image is obtained by the same method as used in the optimal focus position detection processing (step S123). Then, the y-direction stigmater setting step S120 to the sharpness calculation step S123 are repeated within a prescribed range (step S124).

Next, the y-direction stigmater value YSmax with a peak sharpness is obtained by the same method as used in the optimal focus position detection processing (step S125). Then, the y-direction stigmater 329 is adjusted to YSmax (step S126).

By the above processing, the correction of the astigmatism in the SEM can be realized.

Figure 38:
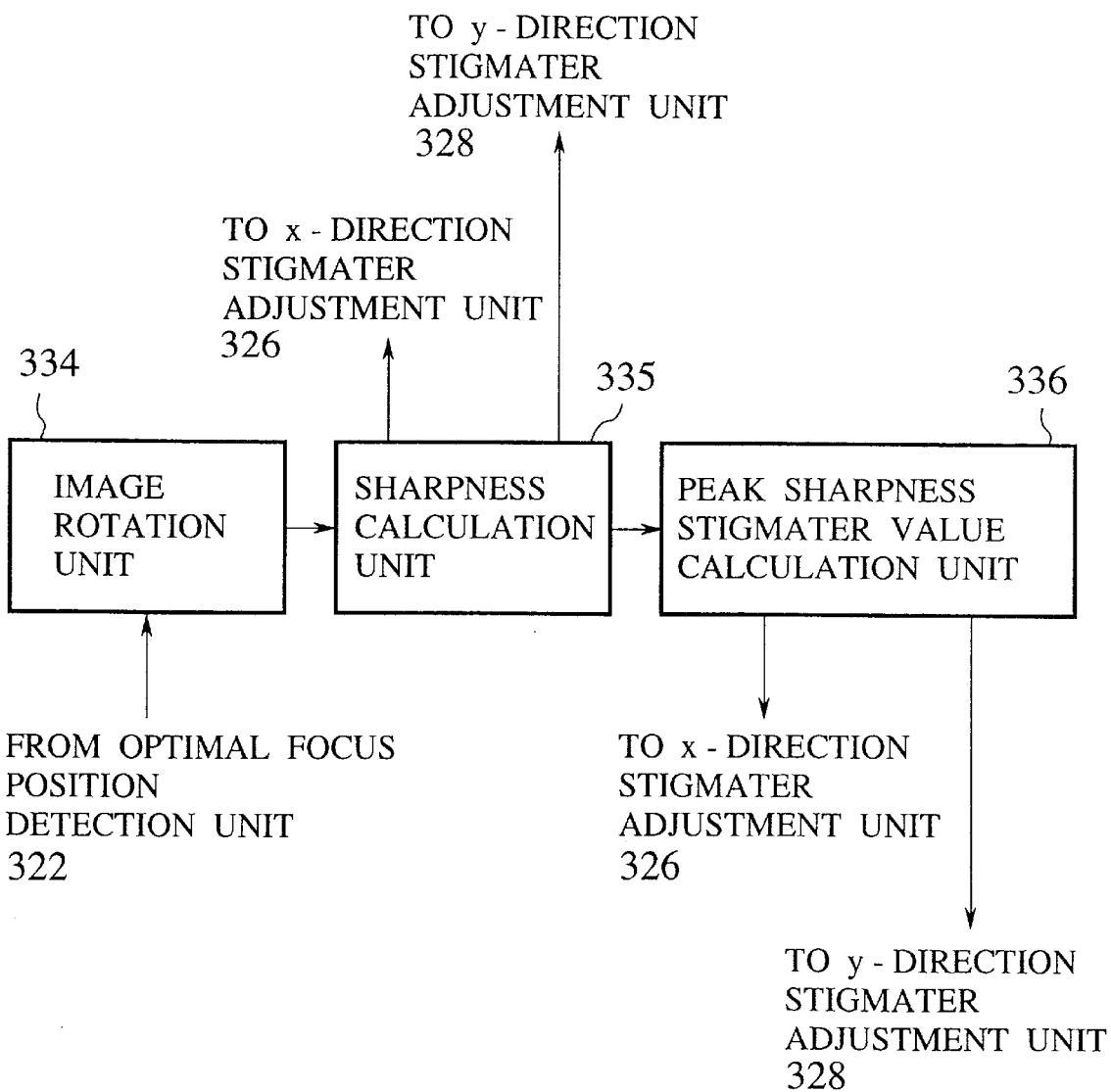
FIG. 38 is a block diagram of an internal configuration of an astigmatism correction unit in the apparatus of FIG. 31.

FIG. 38 shows an internal configuration of the astigmatism correction unit 325 in the astigmatism correction apparatus of FIG. 31.

In this configuration of FIG. 38, the astigmatism correction unit comprises: an image rotation unit 334 for carrying out a rotation of the image at a prescribed rotation angle, with respect to the secondary particle signal image of the adjusted focal point entered from the optimal focus position detection unit 322; a sharpness calculation unit 335 for calculating the sharpness for the rotated image, and outputting stigmater setting values to the x-direction stigmater adjustment unit 326 and the y-direction stigmater adjustment unit 328; and a peak sharpness stigmater value calculation unit 336 for calculating the x-direction or y-direction stigmater value with a peak sharpness from the sharpness curve formed by using the sharpnesses calculated for a plurality of x-direction or y-direction stigmater setting values, and outputting the calculated x-direction or y-direction stigmater value to the x-direction stigmater adjustment unit 326 or the y-direction stigmater adjustment unit 328.

According to this sixth embodiment, the secondary particle signal image is produced by extracting the secondary particle signals that are generated at a time of the two-dimensional scan of the electron beam on the sample, and the focal point of the objective lens 324 is adjusted according to this secondary particle signal image. At this point, the astigmatism is intentionally caused by using the x-direction and y-direction stigmaters 327 and 329, and the direction of the astigmatism is obtained from the secondary particle signal image that is entered in a state where the astigmatism is caused. Then, the secondary particle signal image entered at a prescribed focal point position is rotated so that the direction of the astigmatism becomes horizontal or vertical in the image, and the sharpness of the image is calculated from the rotated secondary particle signal image. Then, a focal point position with a peak sharpness is calculated and the focal point position is adjusted to this calculated focal point position.

Then, the stigmaters are adjusted to make the astigmatism of the electron beam smaller with respect to the secondary particle signal image obtained at the optimal focus position, so as to realize the astigmatism correction. At this point, the x-direction stigmater value is set, and the sharpness of the image obtained by rotating the entered secondary particle signal image is obtained. Then, an x-direction stigmater value at a peak sharpness is calculated, and the x-direction stigmater 327 is adjusted to the calculated x-direction stigmater value. Also, while maintaining the x-direction stigmater value, the y-direction stigmater value is set, and the sharpness of the image obtained by rotating the entered secondary particle signal image is obtained. Then, a y-direction stigmater value at a peak sharpness is calculated, and the y-direction stigmater 329 is adjusted to the calculated y-direction stigmater value.

In this manner, it is possible to automatize the stigmater adjustment without relying on the visual sense of the operator in the SEM for the purpose of observing the sample surface, and therefore it becomes possible to carry out the astigmatism correction at high precision easily, and it becomes possible to prevent the lowering of the observation precision according to the cross sectional shape of the electron beam that can be caused by the astigmatism.

Note that, in the second step for correcting the astigmatism in this sixth embodiment, the y-direction stigmater value is adjusted after adjusting the x-direction stigmater value first, but it is also possible to adjust the x-direction stigmater value after adjusting the y-direction stigmater value first. It is also possible to obtain a position with a peak sharpness by changing the x-direction and y-direction stigmater values simultaneously.

Note also that the sample having circular patterns thereon is used as the standard sample in this sixth embodiment, but the sample is not necessarily limited to this type, and any sample in which the principal axis can be identified by applying the Fourier transform and the binarization to extract the low frequency components can be used as the standard sample.

Note also that this sixth embodiment is not only applicable to an observation device such as SEM, but also applicable to a charged particle beam drawing device for drawing LSI patterns by using the electron beam or ion beam.

It is to be noted that the above described embodiments according to the present invention may be conveniently implemented using a conventional general purpose digital computer programmed according to the teachings of the present specification, as will be apparent to those skilled in the computer art. Appropriate software coding can readily be prepared by skilled programmers based on the teachings of the present disclosure, as will be apparent to those skilled in the software art.

In particular, the electron optics system automatic adjustment apparatus in any of the above described first to fourth embodiments can be conveniently implemented in a form of a software package, up to the function of the optics system adjustment unit 115 of FIG. 6 to control the SEM 111 to carry out the optics system adjustment. Also, the astigmatism correction apparatus in either one of the above described fifth and sixth embodiments can be conveniently implemented in a form of a software packet, up to the function of the adjustment unit 226 of FIG. 25 or the functions of the focal point adjustment unit 323, the x-direction stigmater adjustment unit 326 and the y-direction stigmater adjustment unit 328 to control the SEM to carry out the respective adjustments.

Such a software package can be a computer program product which employs a storage medium including stored computer code which is used to program a computer to perform the disclosed function and process of the present invention. The storage medium may include, but is not limited to, any type of conventional floppy disks, optical disks, CD-ROMs, magneto-optical disks, ROMs, RAMs, EPROMs, EEPROMs, magnetic or optical cards, or any other suitable media for storing electronic instructions.

It is also to be noted that, besides those already mentioned above, many modifications and variations of the above embodiments may be made without departing from the novel and advantageous features of the present invention. Accordingly, all such modifications and variations are intended to be included within the scope of the appended claims.

What is claimed is:

1. An electron optics system automatic adjustment apparatus for automatically adjusting an electron optics system of an electron optics device, comprising:

a focal point adjustment unit for carrying out a focal point adjustment by changing a refractive index of an objective lens of the electron optics device;

an image storage unit for storing a prescribed number of images sequentially obtained by the electron optics device at focal points adjusted by the focal point adjustment unit;

a moving amount calculation unit for calculating a moving amount of a sample image in said prescribed number of images stored by the image storage unit;

an adjustment processing control unit for judging whether an adjustment of the electron optics system of the electron optics device is necessary or not according to the moving amount of the sample image calculated by the moving amount calculation unit; and an optics system adjustment unit for adjusting the electron optics system of the electron optics device according to the moving amount of the sample image when the adjustment processing unit judges that the adjustment of the electron optics system of the electron optics device is necessary.

2. The apparatus of claim 1, wherein the moving amount calculation unit calculates the moving amount of the sample image by applying a binarization processing to said prescribed number of images stored by the image storage unit, obtaining a reference position of the sample image in binarized images, and tracing the reference position.

3. The apparatus of claim 1, wherein the moving amount calculation unit calculates the moving amount of the sample image by carrying out a correlation calculation among said prescribed number of images stored by the image storage unit.

4. The apparatus of claim 1, wherein the moving amount calculation unit calculates the moving amount of the sample image by producing a focus-space image from said prescribed number of images stored by the image storage unit.

5. An electron optics system automatic adjustment method for automatically adjusting an electron optics system of an electron optics device, comprising the steps of:

carrying out a focal point adjustment by changing a refractive index of an objective lens of the electron optics device;

storing a prescribed number of images sequentially obtained by the electron optics device at focal points adjusted by the focal point adjustment;

calculating a moving amount of a sample image in said prescribed number of images stored by the storing step;

judging whether an adjustment of the electron optics system of the electron optics device is necessary or not according to the moving amount of the sample image calculated by the calculating step; and adjusting the electron optics system of the electron optics device according to the moving amount of the sample image when the judging step judges that the adjustment of the electron optics system of the electron optics device is necessary.

6. The method of claim 5, wherein the calculating step calculates the moving amount of the sample image by applying a binarization processing to said prescribed number of images stored by the storing step, obtaining a reference position of the sample image in binarized images, and tracing the reference position.

7. The method of claim 5, wherein the calculating step calculates the moving amount of the sample image by carrying out a correlation calculation among said prescribed number of images stored by the storing step.

8. The method of claim 5, wherein the calculating step calculates the moving amount of the sample image by producing a focus-space image from said prescribed number of images stored by the storing step.

9. An article of manufacture, comprising:

a computer usable medium having computer readable program code means embodied therein for causing a computer to function as an electron optics system automatic adjustment apparatus for automatically adjusting an electron optics system of an electron optics device, the computer readable program code means including:

first computer readable program code means for causing said computer to control the electron optics device to carry out a focal point adjustment by changing a refractive index of an objective lens of the electron optics device;

second computer readable program code means for causing said computer to store a prescribed number of images sequentially obtained by the electron optics device at focal points adjusted by an operation of the first computer readable program code means;

third computer readable program code means for causing said computer to calculate a moving amount of a sample image in said prescribed number of images stored by an operation of the second computer readable program code means;

fourth computer readable program code means for causing said computer to judge whether an adjustment of the electron optics system of the electron optics device is necessary or not according to the moving amount of the sample image calculated by the third computer readable program code means; and fifth computer readable program code means for causing said computer to control the electron optics device to adjust the electron optics system of the electron optics device according to the moving amount of the sample image when the fourth computer readable program code means judges that the adjustment of the electron optics system of the electron optics device is necessary.

10. An astigmatism correction apparatus for correcting an astigmatism in an electron optics device by adjusting a stigmater of a charged particle beam optical system in the electron optics device, comprising:

a secondary particle signal extraction unit for extracting secondary particle signals resulting from a two-dimensional scan of a charged particle beam over a sample by the electron optics device;

a Fourier transform unit for calculating a power spectrum by applying a two-dimensional Fourier transform to the secondary particle signals extracted by the secondary particle signal extraction unit;

a binarization unit for binarizing the power spectrum calculated by the Fourier transform unit to obtain a binarized image;

an axis extraction unit for obtaining a principal axis and an axis perpendicular to the principal axis of the binarized image obtained by the binarization unit;

an astigmatism information calculation unit for determining an intensity and a direction of the astigmatism by obtaining a distance between two points at which a sample image region in the binarized image intersects with the principal axis and a distance between two points at which the sample image region in the binarized image intersect with the axis perpendicular to the principal axis; and an adjustment unit for adjusting the stigmater of the charged particle beam optical system according to the intensity and the direction of the astigmatism determined by the astigmatism information calculation unit.

11. The apparatus of claim 10, wherein the binarization unit obtains the binarized image by obtaining an average A and a standard deviation σ of power spectrum values within a band-shaped region in a power spectrum image in which low frequency components of the power spectrum are arranged at a central region, and binarizing the power spectrum by using a threshold A+2σ.

12. The apparatus of claim 10, wherein the axis extraction unit obtains the principal axis of the binarized image by calculating a central moment of second order of the binarized image.

13. The apparatus of claim 10, wherein the astigmatism information calculation unit determines the direction of the astigmatism as a direction perpendicular to the principal axis.

14. The apparatus of claim 10, wherein the astigmatism information calculation unit determines the intensity of the astigmatism as a ratio of an average distance D1 of points in the binarized image with respect to the principal axis and an average distance D2 of points in the binarized image with respect to the axis perpendicular to the principal axis.

15. The apparatus of claim 10, wherein the astigmatism information calculation unit determines the intensity of the astigmatism as a ratio of a sum S1 of distances of points in the binarized image with respect to the principal axis and a sum S2 of points in the binarized image with respect to the axis perpendicular to the principal axis.

16. An astigmatism correction method for correcting an astigmatism in an electron optics device by adjusting a stigmater of a charged particle beam optical system in the electron optics device, comprising the steps of:

extracting secondary particle signals resulting from a two-dimensional scan of a charged particle beam over a sample by the electron optics device;

calculating a power spectrum by applying a two-dimensional Fourier transform to the secondary particle signals extracted by the extracting step;

binarizing the power spectrum calculated by the calculating step to obtain a binarized image;

obtaining a principal axis and an axis perpendicular to the principal axis of the binarized image obtained by the binarizing step;

determining an intensity and a direction of the astigmatism by obtaining a distance between two points at which a sample image region in the binarized image intersects with the principal axis and a distance between two points at which the sample image region in the binarized image intersect with the axis perpendicular to the principal axis; and adjusting the stigmater of the charged particle beam optical system according to the intensity and the direction of the astigmatism determined by the determining step.

17. The method of claim 16, wherein the binarizing step obtains the binarized image by obtaining an average A and a standard deviation σ of power spectrum values within a band-shaped region in a power spectrum image in which low frequency components of the power spectrum are arranged at a central region, and binarizing the power spectrum by using a threshold A+2σ.

18. The method of claim 16, wherein the obtaining step obtains the principal axis of the binarized image by calculating a central moment of second order of the binarized image.

19. The method of claim 16, wherein the determining step determines the direction of the astigmatism as a direction perpendicular to the principal axis.

20. The method of claim 16, wherein the determining step determines the intensity of the astigmatism as a ratio of an average distance D1 of points in the binarized image with respect to the principal axis and an average distance D2 of points in the binarized image with respect to the axis perpendicular to the principal axis.

21. The method of claim 16, wherein the determining step determines the intensity of the astigmatism as a ratio of a sum S1 of distances of points in the binarized image with respect to the principal axis and a sum S2 of points in the binarized image with respect to the axis perpendicular to the principal axis.

22. An article of manufacture, comprising:

a computer usable medium having computer readable program code means embodied therein for causing a computer to function as an astigmatism correction apparatus for correcting an astigmatism in an electron optics device by adjusting a stigmater of a charged particle beam optical system in the electron optics device, the computer readable program code means including:

first computer readable program code means for causing said computer to extract secondary particle signals resulting from a two-dimensional scan of a charged particle beam over a sample by the electron optics device;

second computer readable program code means for causing said computer to calculate a power spectrum by applying a two-dimensional Fourier transform to the secondary particle signals extracted by the first computer readable program code means;

third computer readable program code means for causing said computer to binarize the power spectrum calculated by the second computer readable program code means to obtain a binarized image;

fourth computer readable program code means for causing said computer to obtain a principal axis and an axis perpendicular to the principal axis of the binarized image obtained by the third computer readable program code means;

fifth computer readable program code means for causing said computer to determine an intensity and a direction of the astigmatism by obtaining a distance between two points at which a sample image region in the binarized image intersects with the principal axis and a distance between two points at which the sample image region in the binarized image intersect with the axis perpendicular to the principal axis; and sixth computer readable program code means for causing said computer to control the electron optics device to adjust the stigmater of the charged particle beam optical system according to the intensity and the direction of the astigmatism determined by the fifth computer readable program code means.

23. An astigmatism correction apparatus for correcting an astigmatism in an electron optics device by adjusting a stigmater of a charged particle beam optical system in the electron optics device, comprising:

a first unit for adjusting a focal point of a lens system of the charged particle beam optical system according to a secondary particle signal image produced by extracting secondary particle signals resulting from a two-dimensional scan of a charged particle beam over a sample; and a second unit for correcting the astigmatism by adjusting the stigmater so as to make the astigmatism of the charged particle beam small according to the secondary particle signal image for which the focal point is adjusted by the first unit.

24. The apparatus of claim 23, wherein the first unit includes:

a secondary particle signal image input unit for entering the secondary particle signal image;

an optimal focus position detection unit for determining an optimal focus position by using the secondary particle signal image entered by the secondary particle signal image input unit; and a focal point adjustment unit for controlling the lens system of the charged particle beam optical system to adjust the focal point to the optimal focus position determined by the optimal focus position detection unit; and wherein the second unit adjust the stigmater according to the secondary particle signal image entered by the secondary particle signal image input unit after the focal point is adjusted to the optimal focus position by the focal point adjustment unit.

25. The apparatus of claim 23, wherein the first unit adjust the focal point by: causing the astigmatism by controlling the stigmater; entering the secondary particle signal image in a first state where the astigmatism is caused; obtaining a direction of the astigmatism from the secondary particle signal image in the first state; sequentially setting the focal point to prescribed positions; sequentially entering each secondary particle signal image in a second state where the focal point position is adjusted to each prescribed position; rotating each secondary particle signal image in the second state so that the direction of the astigmatism becomes horizontal or vertical in a rotated secondary particle signal image; calculating a sharpness of each rotated secondary particle signal image; calculating a focal point position with a peak sharpness according to sharpnesses of rotated secondary particle signal images calculated with respect to the prescribed positions; and adjusting the focal point to the focal point position with the peak sharpness.

26. The apparatus of claim 25, wherein the first unit calculates the sharpness of each rotated secondary particle signal image by: setting a plurality of search regions around each point in each rotated secondary particle signal image; dividing each search region into two regions; obtaining a variance value between said two regions for each search region; determining a variance value of each point as a maximum value or an average value of variance values obtained for said plurality of search regions; and calculating the sharpness of each rotated secondary particle signal image as a sum or an average value of variance values of points within a prescribed region of each rotated secondary particle signal image.

27. The apparatus of claim 25, wherein the first unit calculates the sharpness of each rotated secondary particle signal image by: setting vertical and horizontal search regions having each point in each rotated secondary particle signal image as a center of gravity; dividing each search region into two regions A and B centered around each point in each rotated secondary particle signal image; obtaining a variance value $\sigma$ between said two regions A and B for each search region according to:

$$\sigma = (m_A - m_T) \times (m_A - m_T) + (m_B - m_T) \times (m_B - m_T)$$

where $m_A$ and $m_B$ are average luminances of pixels contained in said two regions A and B respectively, while $m_T$ is an average luminance of each search region combining said two regions A and B; determining a variance value of each point as a maximum value or an average value of variance values obtained for the vertical and horizontal search regions; and calculating the sharpness of each rotated secondary particle signal image as a sum or an average value of variance values of points within a prescribed region of each rotated secondary particle signal image.

28. The apparatus of claim 23, wherein the stigmater is formed by an x-direction stigmater and a y-direction stigmater, and the second unit corrects the astigmatism by: sequentially setting prescribed x-direction stigmater values; sequentially entering each first secondary particle signal image with the x-direction stigmater adjusted to each prescribed x-direction stigmater value; rotating each first secondary particle signal image for a first prescribed angle; calculating a sharpness of each rotated first secondary particle signal image; determining an x-direction stigmater value with a peak sharpness among sharpnesses calculated with respect to the prescribed x-direction stigmater values; adjusting the x-direction stigmater to the x-direction stigmater value with the peak sharpness; sequentially setting prescribed y-direction stigmater values; sequentially entering each second secondary particle signal image with the y-direction stigmater adjusted to each prescribed y-direction stigmater value; rotating each second secondary particle signal image for a second prescribed angle; calculating a sharpness of each rotated second secondary particle signal image; determining an y-direction stigmater value with a peak sharpness among sharpnesses calculated with respect to the prescribed y-direction stigmater values; adjusting the y-direction stigmater to the y-direction stigmater value with the peak sharpness.

29. The apparatus of claim 28, wherein the second unit calculates the sharpness of each rotated first or second secondary particle signal image by: setting a plurality of search regions around each point in each rotated first or second secondary particle signal image; dividing each search region into two regions; obtaining a variance value between said two regions for each search region; determining a variance value of each point as a maximum value or an average value of variance values obtained for said plurality of search regions; and calculating the sharpness of each rotated first or second secondary particle signal image as a sum or an average value of variance values of points within a prescribed region of each rotated first or second secondary particle signal image.

30. The apparatus of claim 28, wherein the first unit calculates the sharpness of each rotated first or second secondary particle signal image by: setting vertical and horizontal search regions having each point in each rotated first or second secondary particle signal image as a center of gravity; dividing each search region into two regions A and B centered around each point in each rotated first or second secondary particle signal image; obtaining a variance value σ between said two regions A and B for each search region according to:

$$\sigma = (m_A - m_T) \times (m_A - m_T) + (m_B - m_T) \times (m_B - m_T)$$

where $m_A$ and $m_B$ are average luminances of pixels contained in said two regions A and B respectively, while $m_T$ is an average luminance of each search region combining said two regions A and B; determining a variance value of each point as a maximum value or an average value of variance values obtained for the vertical and horizontal search regions; and calculating the sharpness of each rotated first or second secondary particle signal image as a sum or an average value of variance values of points within a prescribed region of each rotated first or second secondary particle signal image.

31. An astigmatism correction method for correcting an astigmatism in an electron optics device by adjusting a stigmater of a charged particle beam optical system in the electron optics device, comprising:

a first step for adjusting a focal point of a lens system of the charged particle beam optical system according to a secondary particle signal image produced by extracting secondary particle signals resulting from a two-dimensional scan of a charged particle beam over a sample; and a second step for correcting the astigmatism by adjusting the stigmater so as to make the astigmatism of the charged particle beam small according to the secondary particle signal image for which the focal point is adjusted by the first step.

32. The method of claim 31, wherein the first step includes:

a secondary particle signal image input step for entering the secondary particle signal image;

an optimal focus position detection step for determining an optimal focus position by using the secondary particle signal image entered by the secondary particle signal image input step; and a focal point adjustment step for controlling the lens system of the charged particle beam optical system to adjust the focal point to the optimal focus position determined by the optimal focus position detection step; and wherein the second step adjust the stigmater according to the secondary particle signal image entered by the secondary particle signal image input step after the focal point is adjusted to the optimal focus position by the focal point adjustment step.

33. The method of claim 31, wherein the first step adjust the focal point by: causing the astigmatism by controlling the stigmater; entering the secondary particle signal image in a first state where the astigmatism is caused; obtaining a direction of the astigmatism from the secondary particle signal image in the first state; sequentially setting the focal point to prescribed positions; sequentially entering each secondary particle signal image in a second state where the focal point position is adjusted to each prescribed position; rotating each secondary particle signal image in the second state so that the direction of the astigmatism becomes horizontal or vertical in a rotated secondary particle signal image; calculating a sharpness of each rotated secondary particle signal image; calculating a focal point position with a peak sharpness according to sharpnesses of rotated secondary particle signal images calculated with respect to the prescribed positions; and adjusting the focal point to the focal point position with the peak sharpness.

34. The method of claim 33, wherein the first step calculates the sharpness of each rotated secondary particle signal image by: setting a plurality of search regions around each point in each rotated secondary particle signal image; dividing each search region into two regions; obtaining a variance value between said two regions for each search region; determining a variance value of each point as a maximum value or an average value of variance values obtained for said plurality of search regions; and calculating the sharpness of each rotated secondary particle signal image as a sum or an average value of variance values of points within a prescribed region of each rotated secondary particle signal image.

35. The method of claim 33, wherein the first step calculates the sharpness of each rotated secondary particle signal image by: setting vertical and horizontal search regions having each point in each rotated secondary particle signal image as a center of gravity; dividing each search region into two regions A and B centered around each point in each rotated secondary particle signal image; obtaining a variance value σ between said two regions A and B for each search region according to:

$$\sigma = (m_A - m_T) \times (m_A - m_T) + (m_B - m_T) \times (m_B - m_T)$$

where $m_A$ and $m_B$ are average luminances of pixels contained in said two regions A and B respectively, while $m_T$ is an average luminance of each search region combining said two regions A and B; determining a variance value of each point as a maximum value or an average value of variance values obtained for the vertical and horizontal search regions; and calculating the sharpness of each rotated secondary particle signal image as a sum or an average value of variance values of points within a prescribed region of each rotated secondary particle signal image.

36. The method of claim 31, wherein the stigmater is formed by an x-direction stigmater and a y-direction stigmater, and the second step corrects the astigmatism by: sequentially setting prescribed x-direction stigmater values; sequentially entering each first secondary particle signal image with the x-direction stigmater adjusted to each prescribed x-direction stigmater value; rotating each first secondary particle signal image for a first prescribed angle; calculating a sharpness of each rotated first secondary particle signal image; determining an x-direction stigmater value with a peak sharpness among sharpnesses calculated with respect to the prescribed x-direction stigmater values; adjusting the x-direction stigmater to the x-direction stigmater value with the peak sharpness; sequentially setting prescribed y-direction stigmater values; sequentially entering each second secondary particle signal image with the y-direction stigmater adjusted to each prescribed y-direction stigmater value; rotating each second secondary particle signal image for a second prescribed angle; calculating a sharpness of each rotated second secondary particle signal image; determining an y-direction stigmater value with a peak sharpness among sharpnesses calculated with respect to the prescribed y-direction stigmater values; adjusting the y-direction stigmater to the y-direction stigmater value with the peak sharpness.

37. The method of claim 36, wherein the second step calculates the sharpness of each rotated first or second secondary particle signal image by: setting a plurality of search regions around each point in each rotated first or second secondary particle signal image; dividing each search region into two regions; obtaining a variance value between said two regions for each search region; determining a variance value of each point as a maximum value or an average value of variance values obtained for said plurality of search regions; and calculating the sharpness of each rotated first or second secondary particle signal image as a sum or an average value of variance values of points within a prescribed region of each rotated first or second secondary particle signal image.

38. The method of claim 36, wherein the first step calculates the sharpness of each rotated first or second secondary particle signal image by: setting vertical and horizontal search regions having each point in each rotated first or second secondary particle signal image as a center of gravity; dividing each search region into two regions A and B centered around each point in each rotated first or second secondary particle signal image; obtaining a variance value σ between said two regions A and B for each search region according to:

$$\sigma = (m_A - m_T) \times (m_A - m_T) + (m_B - m_T) \times (m_B - m_T)$$

where $m_A$ and $m_B$ are average luminances of pixels contained in said two regions A and B respectively, while $m_T$ is an average luminance of each search region combining said two regions A and B; determining a variance value of each point as a maximum value or an average value of variance values obtained for the vertical and horizontal search regions; and calculating the sharpness of each rotated first or second secondary particle signal image as a sum or an average value of variance values of points within a prescribed region of each rotated first or second secondary particle signal image.

39. An article of manufacture, comprising:

a computer usable medium having computer readable program code means embodied therein for causing a computer to function as an astigmatism correction apparatus for correcting an astigmatism in an electron optics device by adjusting a stigmater of a charged particle beam optical system in the electron optics device, the computer readable program code means including:

first computer readable program code means for causing said computer to control the electron optics device to adjust a focal point of a lens system of the charged particle beam optical system according to a secondary particle signal image produced by extracting secondary particle signals resulting from a two-dimensional scan of a charged particle beam over a sample; and second computer readable program code means for causing said computer to control the electron optics device to correct the astigmatism by adjusting the stigmater so as to make the astigmatism of the charged particle beam small according to the secondary particle signal image for which the focal point is adjusted by an operation of the first computer readable program code means.

\* \* \* \* \*